(12) United States Patent
Yamazaki

(10) Patent No.: US 9,385,238 B2
(45) Date of Patent: Jul. 5, 2016

(54) TRANSISTOR USING OXIDE SEMICONDUCTOR

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/537,365

(22) Filed: Jun. 29, 2012

(65) Prior Publication Data
US 2013/0009148 A1 Jan. 10, 2013

(30) Foreign Application Priority Data

Jul. 8, 2011 (JP) ................................. 2011-152164

(51) Int. Cl.
*H01L 29/786* (2006.01)

(52) U.S. Cl.
CPC ...... *H01L 29/7869* (2013.01); *H01L 29/78606* (2013.01)

(58) Field of Classification Search
CPC ..................... H01L 29/7869; H01L 29/78606
USPC ........................................................ 257/43
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |

(Continued)

FOREIGN PATENT DOCUMENTS

| | | |
|---|---|---|
| CN | 1806322 A | 7/2006 |
| CN | 101621075 A | 1/2010 |

(Continued)

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008, with Full English Translation.

(Continued)

*Primary Examiner* — Duy T Nguyen
*Assistant Examiner* — Mounir Amer
(74) *Attorney, Agent, or Firm* — Fish & Richardson P.C.

(57) ABSTRACT

Stable electrical characteristics and high reliability are provided for a semiconductor device including an oxide semiconductor. In a transistor including an oxide semiconductor layer, a buffer layer containing a constituent similar to that of the oxide semiconductor layer is provided in contact with a top surface and a bottom surface of the oxide semiconductor layer. Such a transistor and a semiconductor device including the transistor are provided. As the buffer layer in contact with the oxide semiconductor layer, a film containing an oxide of one or more elements selected from aluminum, gallium, zirconium, hafnium, and a rare earth element can be used.

19 Claims, 10 Drawing Sheets

(56) References Cited

U.S. PATENT DOCUMENTS

| | | | |
|---|---|---|---|
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,786,514 B2 * | 8/2010 | Fang et al. | 257/213 |
| 7,791,072 B2 | 9/2010 | Kumomi et al. |
| 7,994,500 B2 | 8/2011 | Kim et al. |
| 8,058,645 B2 | 11/2011 | Jeong et al. |
| 8,093,589 B2 | 1/2012 | Sugihara et al. |
| 8,129,719 B2 | 3/2012 | Yamazaki et al. |
| 8,148,779 B2 | 4/2012 | Jeong et al. |
| 8,188,480 B2 | 5/2012 | Itai |
| 8,203,143 B2 | 6/2012 | Imai |
| 8,384,076 B2 | 2/2013 | Park et al. |
| 8,497,502 B2 | 7/2013 | Yaegashi |
| 8,502,221 B2 | 8/2013 | Yamazaki |
| 8,653,514 B2 | 2/2014 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0321731 A1 * | 12/2009 | Jeong et al. | 257/43 |
| 2009/0321732 A1 * | 12/2009 | Kim et al. | 257/43 |
| 2010/0006833 A1 | 1/2010 | Ha et al. |
| 2010/0025676 A1 | 2/2010 | Yamazaki et al. |
| 2010/0038641 A1 | 2/2010 | Imai |
| 2010/0051937 A1 | 3/2010 | Kaji et al. |
| 2010/0059746 A1 | 3/2010 | Itai |
| 2010/0065844 A1 | 3/2010 | Tokunaga |
| 2010/0090217 A1 * | 4/2010 | Akimoto | 257/43 |
| 2010/0092800 A1 | 4/2010 | Itagaki et al. |
| 2010/0109002 A1 | 5/2010 | Itagaki et al. |
| 2010/0163863 A1 | 7/2010 | Yaegashi |
| 2010/0176717 A1 * | 7/2010 | Lee et al. | 313/504 |
| 2010/0193784 A1 * | 8/2010 | Morosawa et al. | 257/43 |
| 2010/0207118 A1 * | 8/2010 | Sakata et al. | 257/43 |
| 2010/0244022 A1 | 9/2010 | Takahashi et al. |
| 2010/0244029 A1 * | 9/2010 | Yamazaki et al. | 257/52 |
| 2010/0295041 A1 | 11/2010 | Kumomi et al. |
| 2011/0121299 A1 * | 5/2011 | Kim et al. | 257/59 |
| 2011/0133191 A1 * | 6/2011 | Yamazaki | 257/57 |
| 2011/0175090 A1 | 7/2011 | Sugihara et al. |
| 2011/0193083 A1 | 8/2011 | Kim et al. |
| 2011/0215324 A1 * | 9/2011 | Shen et al. | 257/57 |
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0248260 A1 | 10/2011 | Yamazaki |
| 2011/0248261 A1 | 10/2011 | Yamazaki |
| 2011/0256673 A1 | 10/2011 | Yamazaki et al. |
| 2012/0007086 A1 * | 1/2012 | Oh et al. | H01L 29/458 257/59 |
| 2012/0119205 A1 | 5/2012 | Taniguchi et al. |
| 2012/0132908 A1 | 5/2012 | Sugihara et al. |
| 2012/0153278 A1 | 6/2012 | Jeong et al. |
| 2013/0313550 A1 | 11/2013 | Yamazaki |
| 2014/0151695 A1 | 6/2014 | Yamazaki |

FOREIGN PATENT DOCUMENTS

| | | |
|---|---|---|
| CN | 101640220 A | 2/2010 |
| CN | 101807600 A | 8/2010 |
| CN | 101916785 A | 12/2010 |
| EP | 1 737 044 A1 | 12/2006 |
| EP | 2120267 A | 11/2009 |
| EP | 2 141 743 A1 | 1/2010 |
| EP | 2141744 A1 | 1/2010 |
| EP | 2 226 847 A2 | 9/2010 |
| EP | 2408011 A | 1/2012 |
| EP | 2927965 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| | | |
|---|---|---|
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003273361 A | 9/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2006165528 A | 6/2006 |
| JP | 2007-115808 A | 5/2007 |
| JP | 2009176865 A | 8/2009 |
| JP | 2009231613 A | 10/2009 |
| JP | 2009-278115 A | 11/2009 |
| JP | 2010-016348 A | 1/2010 |
| JP | 2010016347 A | 1/2010 |
| JP | 2010-034534 A | 2/2010 |
| JP | 2010-056540 A | 3/2010 |
| JP | 2010067954 A | 3/2010 |
| JP | 2010-212672 A | 9/2010 |
| KR | 10-0745254 B1 | 8/2007 |
| WO | 2004/114391 A1 | 12/2004 |
| WO | 2009093722 A1 | 7/2009 |

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates, D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543

Fung, T et al., "2-D Numerical Simulation of High Performance Amorphous In-Ga-Zn-O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for Amlcds," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5') Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] At Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

(56) References Cited

OTHER PUBLICATIONS

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business." SID Digest '07 : SID International Symposium Digest of Technical Papers, 2007, vol. 38, pp. 1673-'1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308

Nomura, K et al., "Room-Temperature Fabrication of Transparent Flexible Thin-Film Transistors Using Amorphous Oxide Semiconductors," Nature, Nov. 25, 2004, vol. 432, pp. 488-492

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED." AM-FPD '08 Digest of Technical Papers, Jul. 2, 2008, pp. 275-278.

Park. S et al., "Challenge to Future Displays: Transparent AM-OLED Driven by Peald Grown ZnO TFT," Imid '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652

Sakata, J et al., "Development of 4.0-In. AMOLED Display With Driver Circuit Using Amorphous In-Ga-Zn-Oxide Tfts," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report (PCT Application No. PCT/JP2012/004266) dated Jul. 31, 2012.

Written Opinion (PCT Application No. PCT/JP2012/004266) dated Jul. 31, 2012.

\* cited by examiner

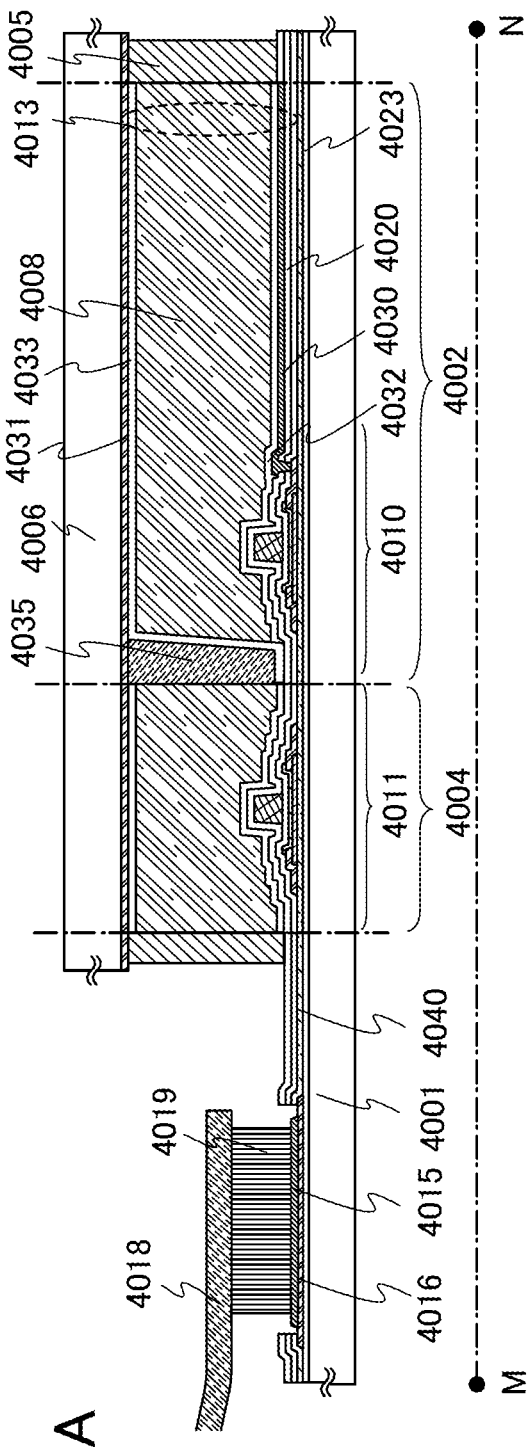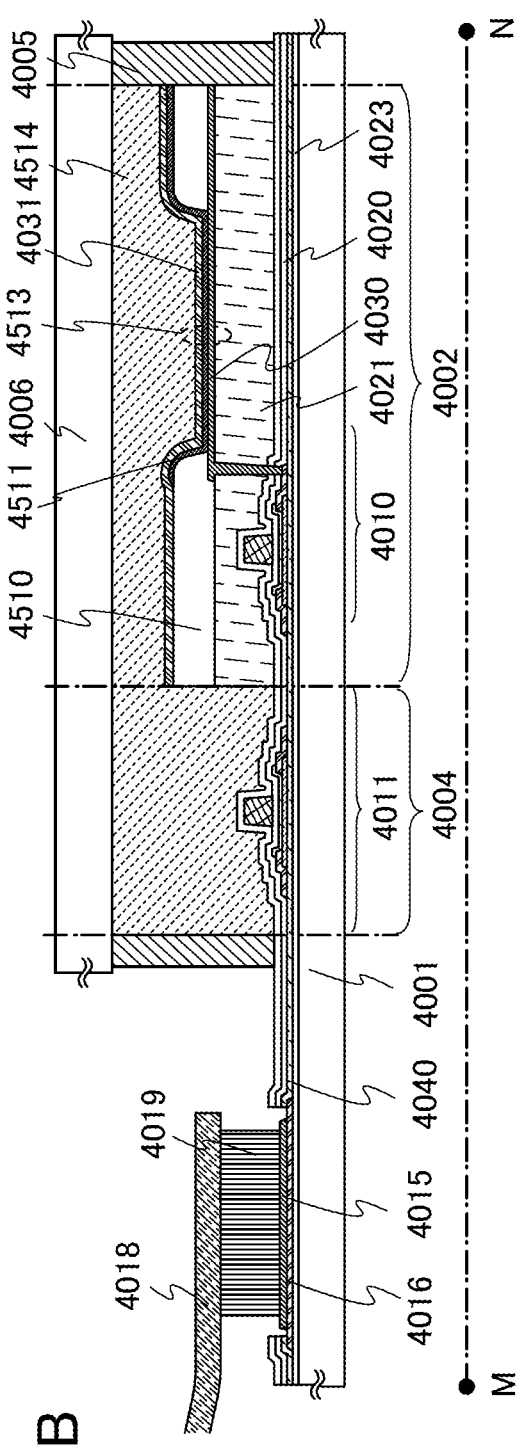
FIG. 8A
FIG. 8B

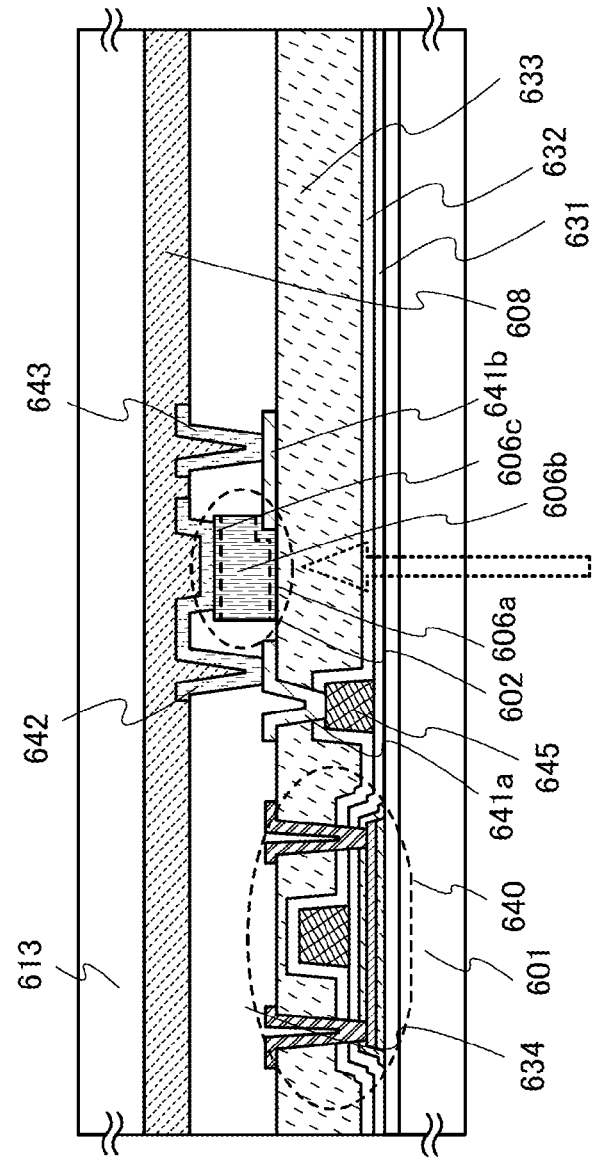

TRANSISTOR USING OXIDE SEMICONDUCTOR

TECHNICAL FIELD

The present invention relates to a semiconductor device and a method of manufacturing the semiconductor device.

In this specification, a semiconductor device means all types of devices that can function by utilizing semiconductor characteristics, and an electro-optical device, a semiconductor circuit, and an electronic device are all semiconductor devices.

BACKGROUND ART

A technique by which transistors are formed using semiconductor thin films over a substrate having an insulating surface has been attracting attention. The transistor is applied to a wide range of electronic devices such as an integrated circuit (IC) and an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide containing indium (In), gallium (Ga), and zinc (Zn) and having an electron carrier concentration lower than $10^{18}/cm^3$ is disclosed (see Patent Document 1).

A transistor including an oxide semiconductor is known to have a problem of low reliability because of high possibility of change in electrical characteristics, although the transistor including an oxide semiconductor can operate at higher speed than a transistor including amorphous silicon and can be manufactured more easily than a transistor including polycrystalline silicon. For example, comparing the transistor before a BT test under light irradiation with that after the BT test under light irradiation, the threshold voltage of the transistor is changed by 1 V or more.

REFERENCE

Patent Document

[Patent Document 1] Japanese Published Patent Application No. 2006-165528

DISCLOSURE OF INVENTION

In view of the above problems, an object of one embodiment of the present invention is to provide a semiconductor device including an oxide semiconductor, which has stable electrical characteristics and high reliability.

One embodiment of the disclosed invention is a semiconductor device including an oxide semiconductor layer, and a first buffer layer and a second buffer layer provided so that the oxide semiconductor layer is sandwiched therebetween. As each of the first buffer layer and the second buffer layer, a film containing an oxide of one or more elements selected from aluminum, gallium, zirconium, hafnium, and a rare earth element can be used. Specifically, the following structure can be employed, for example.

One embodiment of the present invention is a semiconductor device including a first buffer layer; an oxide semiconductor layer provided on and in contact with the first buffer layer; a second buffer layer provided on and in contact with the oxide semiconductor layer so as to cover a side surface of the oxide semiconductor layer; a gate insulating film provided over the second buffer layer; a gate electrode layer overlapping with the oxide semiconductor layer with the gate insulating film therebetween; an insulating film which is provided over the gate electrode layer and has openings; and a source electrode layer and a drain electrode layer provided over the insulating film and electrically connected to the oxide semiconductor layer through the openings. The first buffer layer and the second buffer layer each contain an oxide of one or more elements selected from aluminum, gallium, zirconium, hafnium, and a rare earth element.

In the case where a silicon oxide film, which contains silicon that is a Group 14 element, is used as an insulating layer in contact with the oxide semiconductor layer, the interface between the oxide semiconductor layer and the silicon oxide film is less likely to be stable due to a difference in coordination number between the oxide semiconductor material and silicon, and thus an interface state might be formed. In a transistor according to one embodiment of the present invention, an oxide containing a constituent similar to that of the oxide semiconductor layer is used for the buffer layer in contact with the oxide semiconductor layer; thus, formation of an interface state at the interface between the oxide semiconductor layer and the buffer layer can be prevented, and the transistor can have excellent electrical characteristics and high stability.

Another embodiment of the present invention is a semiconductor device including a first buffer layer; an oxide semiconductor layer provided on and in contact with the first buffer layer; a second buffer layer provided on and in contact with the oxide semiconductor layer so as to cover a side surface of the first buffer layer and a side surface of the oxide semiconductor layer; a gate insulating film provided over the second buffer layer; a gate electrode layer overlapping with the oxide semiconductor layer with the gate insulating film therebetween; an insulating film which is provided over the gate electrode layer and has openings; and a source electrode layer and a drain electrode layer provided over the insulating film and electrically connected to the oxide semiconductor layer through the openings. The first buffer layer and the second buffer layer each contain an oxide of one or more elements selected from aluminum, gallium, zirconium, hafnium, and a rare earth element.

In any of the above semiconductor devices, the oxide semiconductor layer preferably at least partly includes a region containing oxygen in excess of the stoichiometric ratio in a crystalline state.

The oxide semiconductor layer is preferably a crystalline semiconductor layer. In this specification and the like, the crystalline oxide semiconductor layer is an oxide semiconductor layer which includes crystals and which has crystallinity. The crystals in the crystalline oxide semiconductor layer may have crystal axes oriented in random directions or in a certain direction.

In one embodiment of the invention disclosed in this specification, a CAAC-OS (c-axis aligned crystalline oxide semiconductor) film can be used as the crystalline oxide semiconductor layer.

The CAAC-OS film is not completely single crystal nor completely amorphous. The CAAC-OS film is an oxide semiconductor film with a crystal-amorphous mixed phase structure where crystal parts and amorphous parts are included. Note that in most cases, the crystal part fits inside a cube whose one side is less than 100 nm. In an image observed with a transmission electron microscope (TEM), a grain boundary in the CAAC-OS film is not found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

The use of the CAAC-OS film for a transistor enables a change in the electrical characteristics of the transistor due to irradiation with visible light or ultraviolet light to be suppressed, so that a highly reliable semiconductor device can be provided.

In any of the above semiconductor devices, a region in the oxide semiconductor layer, which does not overlap with the gate electrode layer, preferably contains a dopant. With such a structure, the oxide semiconductor layer has a channel formation region which overlaps with the gate electrode layer with the gate insulating film therebetween, and a pair of low-resistance regions between which the channel formation region is sandwiched in the channel length direction.

With an oxide semiconductor layer including low-resistance regions between which a channel formation region is sandwiched in the channel length direction, the transistor has excellent on characteristics (e.g., on-state current and field-effect mobility) and enables high-speed operation and high-speed response. Further, the low-resistance regions are formed in a self-aligned manner and do not overlap with the gate electrode layer; thus, parasitic capacitance can be reduced. A reduction in parasitic capacitance leads to lowering of power consumption of the whole semiconductor device.

The concentration of the dopant in the low-resistance regions is preferably higher than or equal to $5\times10^{18}/cm^3$ and lower than or equal to $1\times10^{22}/cm^3$.

Note that the term such as "over" in this specification and the like does not necessarily mean that a component is placed "directly on" another component. For example, the expression "a gate electrode over a gate insulating layer" does not exclude the case where a component is placed between the gate insulating layer and the gate electrode. The same applies to the term "below".

In addition, in this specification and the like, the term "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

According to one embodiment of the present invention, a highly reliable semiconductor device including an oxide semiconductor and a method of manufacturing the semiconductor device can be provided.

BRIEF DESCRIPTION OF DRAWINGS

FIGS. 8A and 8B each illustrate one embodiment of a semiconductor device.

FIGS. 9A and 9B illustrate one embodiment of a semiconductor device.

BEST MODE FOR CARRYING OUT THE INVENTION

Figure 1A:
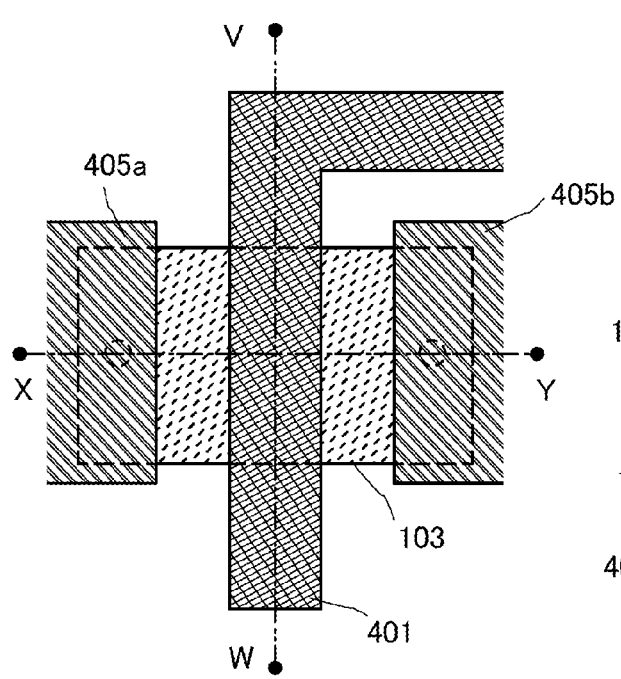
FIGS. 1A to 1C are a plan view and cross-sectional views illustrating one embodiment of a semiconductor device.

Hereinafter, embodiments of the present invention will be described in detail with reference to the accompanying drawings. Note that the present invention is not limited to the description below, and it is easily understood by those skilled in the art that modes and details disclosed herein can be modified in various ways. Therefore, the present invention is not construed as being limited to the description of the embodiments below.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, the scale of each structure is not necessarily limited to that illustrated in the drawings.

Note that the ordinal numbers such as "first" and "second" in this specification and the like are used for convenience and do not denote the order of steps or the stacking order of layers.

In addition, the ordinal numbers in this specification and the like do not denote particular names which specify the present invention.

Embodiment 1

In this embodiment, one embodiment of a semiconductor device and a method of manufacturing the semiconductor device will be described with reference to FIGS. 1A to 1C, FIGS. 2A to 2E, and FIGS. 3A and 3B. In this embodiment, a transistor including an oxide semiconductor layer will be described as an example of the semiconductor device.

Figure 1C:
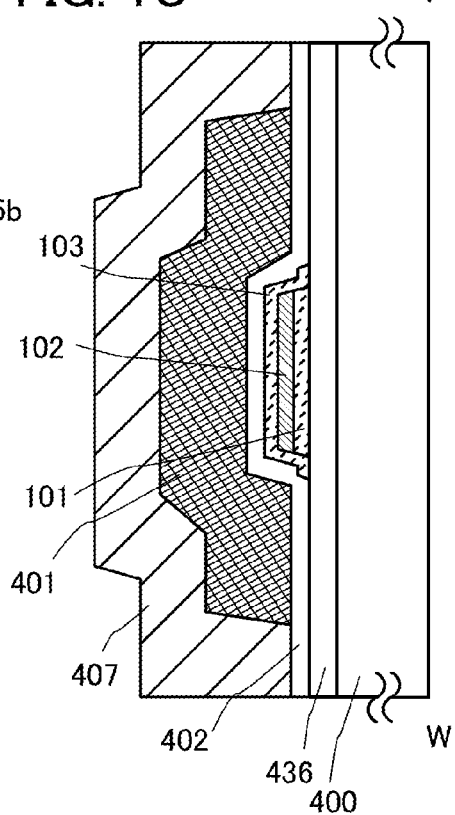
Figure 1B:
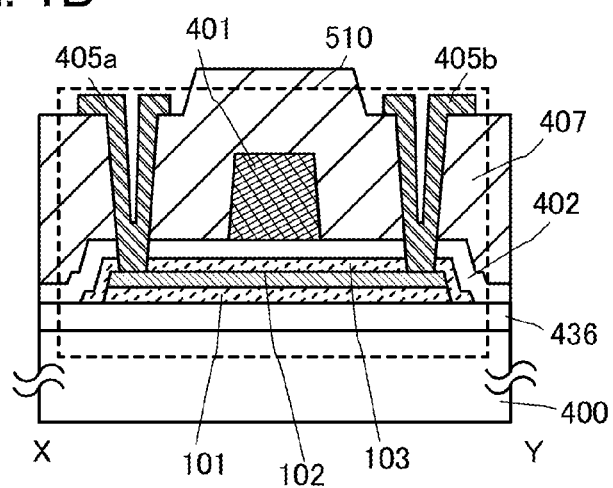

A transistor 510 illustrated in FIG. 1A, FIG. 1B, and FIG. 1C is an example of a top-gate transistor. FIG. 1A is a plan view, FIG. 1B is a cross-sectional view taken along chain line X-Y in FIG. 1A, and FIG. 1C is a cross-sectional view taken along chain line V-W in FIG. 1A.

As illustrated in FIG. 1B, which is a cross-sectional view in the channel length direction, the transistor 510 includes a first buffer layer 101, an oxide semiconductor layer 102, a second buffer layer 103, a gate insulating film 402, a gate electrode layer 401, an insulating film 407, a source electrode layer 405a, and a drain electrode layer 405b over a substrate 400 having an insulating surface on which an oxide insulating film 436 is provided.

In the transistor 510, the first buffer layer 101 is formed on and in contact with the oxide insulating film 436, and the oxide semiconductor layer 102 is formed over the first buffer layer 101. The second buffer layer 103 is formed over the oxide semiconductor layer 102 so as to cover a side surface of the first buffer layer 101 and a side surface of the oxide semiconductor layer 102. The edge portion of the second buffer layer 103 is in contact with the oxide insulating film 436.

Since the first buffer layer 101 and the second buffer layer 103 are in contact with the oxide semiconductor layer 102, they preferably include an oxide containing a constituent similar to that of the oxide semiconductor layer 102. Specifically, the first buffer layer 101 and the second buffer layer 103 preferably include an oxide of one or more elements selected from a constituent element of the oxide semiconductor layer 102 such as aluminum (Al), gallium (Ga), zirconium (Zr), or hafnium (Hf) and a rare earth element in the same group as aluminum, gallium, and the like. Among oxides of these elements, an oxide of aluminum, gallium, or a rare earth element which is a Group III element is more preferably used. As the rare earth element, scandium (Sc), yttrium (Y), cerium (Ce), samarium (Sm), or gadolinium (Gd) is preferably used. Such a material is compatible with the oxide semiconductor layer 102, and the use of such a material for the first buffer layer 101 and the second buffer layer 103 enables a state of the interface between the oxide semiconductor layer 102 and each of these layers to be favorable. Further, the crystallinity of the oxide semiconductor layer 102 can be improved.

Note that since the oxide semiconductor layer 102 serves as an active layer of the transistor 510, the energy gaps of the first buffer layer 101 and the second buffer layer 103 need to be larger than that of the oxide semiconductor layer 102, and the first buffer layer 101 and the second buffer layer 103 preferably have insulating properties.

FIG. 1C is a cross-sectional view in the channel width direction. As in FIG. 1B, in a cross section in the channel width direction of the transistor 510, a side surface of the oxide semiconductor layer 102 is covered with an end portion of the second buffer layer 103. With such a structure, generation of a parasitic channel between the oxide semiconductor layer 102 and the gate electrode layer 401 can be prevented.

FIGS. 2A to 2E illustrate an example of a method of manufacturing the transistor 510.

Figure 2A:
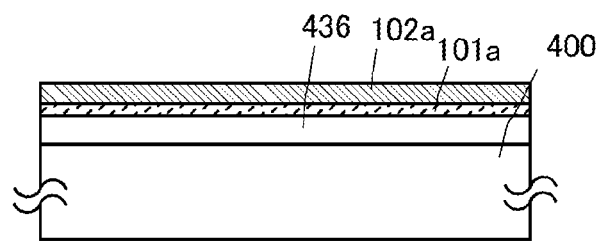
FIGS. 2A to 2E illustrate an example of a manufacturing process of a semiconductor device.

First, the oxide insulating film 436, a first buffer film 101a which is to be the first buffer layer 101, and an oxide semiconductor film 102a which is to be the oxide semiconductor layer 102 are formed in this order over the substrate 400 having an insulating surface (see FIG. 2A).

Although there is no particular limitation on a substrate that can be used as the substrate 400 having an insulating surface, it is necessary that the substrate have at least heat resistance high enough to withstand heat treatment to be performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. In order to manufacture a flexible semiconductor device, the transistor including the oxide semiconductor layer may be directly formed over a flexible substrate. Alternatively, the transistor including the oxide semiconductor layer may be formed over a manufacturing substrate, and then, the transistor may be separated and transferred to a flexible substrate. Note that in order to separate the transistor from the manufacturing substrate and transfer it to the flexible substrate, a separation layer may be provided between the manufacturing substrate and the transistor including the oxide semiconductor layer.

The oxide insulating film 436 can be formed using silicon oxide, silicon oxynitride, or silicon nitride oxide by a plasma CVD method, a sputtering method, or the like. The oxide insulating film 436 may have either a single-layer structure or a layered structure. A silicon oxide film formed by a sputtering method is used as the oxide insulating film 436 in this embodiment.

As the first buffer film 101a, a film containing an oxide of one or more elements selected from aluminum, gallium, zirconium, hafnium, and a rare earth element is formed. Such a material is compatible with the oxide semiconductor layer 102 to be formed later, and therefore, the use of such a material for a layer in contact with the oxide semiconductor layer 102 enables a state of the interface with the oxide semiconductor layer 102 to be kept favorable. Further, the use of such a material for the first buffer layer 101 enables the crystallinity of the oxide semiconductor layer 102 to be improved.

There is no particular limitation on the method of forming the first buffer film 101a, and for example, the first buffer film 101a may be formed by a deposition method such as a plasma CVD method or a sputtering method.

The oxide semiconductor film formed over the first buffer film 101a may have either a single-layer structure or a layered structure. Further, the oxide semiconductor film may either have an amorphous structure or be a crystalline oxide semiconductor. In the case where the oxide semiconductor film 102a has an amorphous structure, heat treatment may be performed on the oxide semiconductor layer in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., further preferably higher than or equal to 500° C., still further preferably higher than or equal to 550° C. Note that this heat treatment may double as another heat treatment in the manufacturing process.

The oxide semiconductor film 102a can be formed by a sputtering method, a molecular beam epitaxy (MBE) method, a CVD method, a pulse laser deposition method, an atomic layer deposition (ALD) method, or the like as appropriate. Alternatively, the oxide semiconductor film 102a may be formed with a sputtering apparatus where film formation is performed with surfaces of a plurality of substrates set substantially perpendicular to a surface of a sputtering target.

In the formation of the oxide semiconductor film 102a, the hydrogen concentration in the oxide semiconductor film 102a is preferably reduced as much as possible. In order to reduce the hydrogen concentration, for example, in the case where the oxide semiconductor film 102a is formed by a sputtering method, oxygen, a high-purity rare gas (typically, argon) from which impurities such as hydrogen, water, a hydroxyl group, and hydride have been removed, or a mixed gas of oxygen and the rare gas is used as appropriate as an atmosphere gas supplied to a process chamber of a sputtering apparatus.

The oxide semiconductor layer is formed in such a manner that a sputtering gas from which hydrogen and moisture have been removed is introduced into the process chamber while moisture remaining therein is removed, whereby the hydrogen concentration in the formed oxide semiconductor layer can be reduced. In order to remove moisture remaining in the process chamber, an entrapment vacuum pump such as a cryopump, an ion pump, or a titanium sublimation pump is preferably used. As an evacuation unit, a turbo molecular pump provided with a cold trap may be used. In the process chamber which is evacuated with the cryopump, a hydrogen atom, a compound containing a hydrogen atom such as water ($H_2O$) (more preferably, also a compound containing a carbon atom), and the like are removed, whereby the impurity concentration in the oxide semiconductor film 102a formed in the process chamber can be reduced.

The oxide insulating film 436, the first buffer film 101a, and the oxide semiconductor film 102a are preferably formed in succession without being exposed to the air. By forming the oxide insulating film 436, the first buffer film 101a, and the oxide semiconductor film 102a in succession without being exposed to the air, impurities such as hydrogen and moisture can be prevented from being adsorbed onto the interface between the oxide insulating film 436 and the first buffer film 101a and the interface between the first buffer film 101a and the oxide semiconductor film 102a.

In order to reduce the impurity concentration in the oxide semiconductor film 102a, it is also effective to form the oxide semiconductor film 102a while the substrate 400 is kept at high temperature. The temperature at which the substrate 400 is heated may be higher than or equal to 150° C. and lower than or equal to 450° C.; the substrate temperature is preferably higher than or equal to 200° C. and lower than or equal to 350° C. By heating the substrate at high temperature during the film formation, a crystalline oxide semiconductor film can be formed.

An oxide semiconductor used for the oxide semiconductor film 102a preferably contains at least indium (In) or zinc (Zn). In particular, In and Zn are preferably contained. As a stabilizer for reducing a variation in electrical characteristics among transistors including the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that it is preferable that the oxide semiconductor film 102a be formed under a condition that much oxygen is contained during film formation (e.g., formed by a sputtering method in a 100% oxygen atmosphere), so as to be a film containing much oxygen (preferably having a region containing oxygen in excess of the stoichiometric ratio in the oxide semiconductor in a crystalline state).

It is preferable that a high-purity gas from which impurities such as hydrogen, water, a hydroxyl group, and hydride have been removed be used as a sputtering gas used for the formation of the oxide semiconductor film 102a.

In this embodiment, the oxide semiconductor film 102a is formed at a film formation temperature higher than or equal to 200° C. and lower than or equal to 450° C. in a rare gas (typically, argon) atmosphere, an oxygen atmosphere, or a mixed atmosphere of a rare gas and oxygen; in such a manner, the crystalline oxide semiconductor film of an oxide semiconductor having a crystalline region is formed.

For example, as the oxide semiconductor having a crystalline region, a CAAC-OS film can be used. There are three methods for obtaining the CAAC-OS film. The first method is to form an oxide semiconductor film at a film formation temperature higher than or equal to 200° C. and lower than or equal to 450° C., thereby obtaining c-axis alignment substantially perpendicular to a surface. The second method is to form a thin oxide semiconductor film and then subject the film to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

In a crystalline oxide semiconductor, defects in a bulk can be further reduced, and when a surface flatness is improved, mobility higher than that of an oxide semiconductor in an amorphous state can be obtained. In order to improve the surface flatness, the oxide semiconductor is preferably formed on a flat surface. Specifically, the oxide semiconductor may be formed on a surface with an average surface roughness ($R_a$) of 1 nm or less, preferably 0.3 nm or less, more preferably 0.1 nm or less.

Note that $R_a$ is obtained by expanding arithmetic mean surface roughness, which is defined by JIS B 0601: 2001 (ISO4287: 1997), into three dimensions so as to be applied to a curved surface. In addition, $R_a$ can be expressed as "an average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \qquad \text{[Formula 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Moreover, $S_0$ represents the area of a rectangle which is obtained by projecting the specific surface on the xy plane, and $Z_0$ represents the height of the reference surface (the average height of the specific surface). Further, $R_a$ can be measured using an atomic force microscope (AFM).

Thus, planarization treatment may be performed on a region of the oxide first buffer film 101a which is in contact with the oxide semiconductor film 102a. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the first buffer film 101a.

In this embodiment, the oxide semiconductor film 102a is formed over the first buffer film 101a which is an oxide film containing a constituent similar to that of the oxide semiconductor film 102a. Therefore, the state of the interface between these two layers can be made favorable, and the crystallinity in the vicinity of the interface can be improved.

Next, the first buffer film 101a and the oxide semiconductor film 102a are processed into island shapes by a photolithography step, so that the first buffer layer 101 and the oxide semiconductor layer 102 are formed.

A resist mask used for forming the first buffer layer 101 and the oxide semiconductor layer 102 may be formed by an inkjet method. Formation of the resist mask by an inkjet method needs no photomask; thus, manufacturing cost can be reduced.

Note that etching of the first buffer film 101a and the oxide semiconductor film 102a may be dry etching, wet etching, or both dry etching and wet etching.

In this embodiment, the first buffer film 101a and the oxide semiconductor film 102a are processed by etching with the use of the same mask, so that end portions of the side surfaces of the first buffer layer 101 and the oxide semiconductor layer 102 formed through the processing are aligned and the first buffer layer 101 and the oxide semiconductor layer 102 have the same shape.

Further, the oxide semiconductor layer 102 is preferably subjected to heat treatment for removing excess hydrogen (including water and a hydroxyl group) in the oxide semiconductor layer 102 (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an n-type impurity, can be removed from the oxide semiconductor by the heat treatment. For example, the hydrogen concentration in the oxide semiconductor layer 102 after the dehydration or dehydrogenation treatment can be $5\times10^{19}/cm^3$ or lower, preferably $5\times10^{18}/cm^3$ or lower.

Note that the heat treatment for the dehydration or dehydrogenation may be performed at any timing in the process of manufacturing the transistor 510 as long as it is performed between the formation of the oxide semiconductor film 102a and formation of the insulating film 407 which is to be formed later. In the case where an aluminum oxide film is formed as the second buffer layer 103, the heat treatment is preferably performed before the second buffer layer 103 is formed. The heat treatment for the dehydration or dehydrogenation may be performed plural times, and may double as another heat treatment.

The heat treatment for the dehydration or dehydrogenation is preferably performed before the oxide semiconductor film 102a is processed into an island shape because oxygen contained in the oxide insulating film 436 can be prevented from being released by the heat treatment.

Note that in the heat treatment, it is preferable that water, hydrogen, and the like be not contained in nitrogen or a rare gas such as helium, neon, or argon. The purity of nitrogen or a rare gas such as helium, neon, or argon which is introduced into a heat treatment apparatus is preferably 6N (99.9999%) or higher, more preferably 7N (99.99999%) or higher (that is, the impurity concentration is preferably 1 ppm or lower, more preferably 0.1 ppm or lower).

In addition, after the oxide semiconductor layer 102 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the $N_2O$ gas. The purity of the oxygen gas or the $N_2O$ gas which is introduced into the heat treatment apparatus is preferably 6N or higher, more preferably 7N or higher (i.e., the impurity concentration in the oxygen gas or the $N_2O$ gas is preferably 1 ppm or lower, more preferably 0.1 ppm or lower). The oxygen gas or the $N_2O$ gas acts to supply oxygen that is a main component of the oxide semiconductor and that has been reduced by removing an impurity for the dehydration or dehydrogenation, so that the oxide semiconductor layer 102 can have high purity and be an i-type (intrinsic) oxide semiconductor layer.

Through this heat treatment, the first buffer layer 101 containing a constituent similar to that of the oxide semiconductor layer 102 can also be highly purified. Further, the crystallinity of the oxide semiconductor layer 102 (in a bulk and the vicinity of the interface with the first buffer layer 101) can also be improved.

Figure 2B:
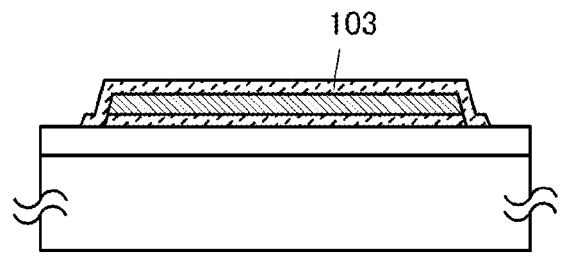

Next, the second buffer layer 103 is formed to cover the island-shaped first buffer layer 101 and the island-shaped oxide semiconductor layer 102 (see FIG. 2B). The deposition conditions of the second buffer layer 103 are the same as those of the first buffer layer 101; thus description thereof is omitted here. Note that by a second photolithography step, the second buffer layer 103 which overlaps with the oxide semiconductor layer 102 and has a top surface shape larger than a plan area of the oxide semiconductor layer 102 is formed. Since the second buffer layer 103 is an oxide film containing a constituent similar to that of the oxide semiconductor layer 102, the state of the interface between these two layers can be made favorable. Further, the crystallinity in the vicinity of the interface between the oxide semiconductor layer 102 and the second buffer layer 103 can be improved.

Figure 2C:
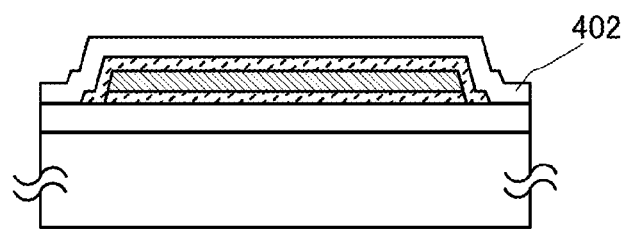

Next, the gate insulating film 402 is formed to cover the second buffer layer 103 (see FIG. 2C).

The gate insulating film 402 can be formed with a thickness greater than or equal to 1 nm and less than or equal to 20 nm by a sputtering method, an MBE method, a CVD method, a pulsed laser deposition method, an ALD method, or the like as appropriate. The gate insulating film 402 may be formed with a sputtering apparatus where film formation is performed with surfaces of a plurality of substrates set substantially perpendicular to a surface of a sputtering target.

The gate insulating film 402 can be formed using a silicon oxide film, a silicon nitride film, a silicon oxynitride film, or a silicon nitride oxide film. The gate insulating film 402 may have either a single-layer structure or a layered structure.

Figure 2D:
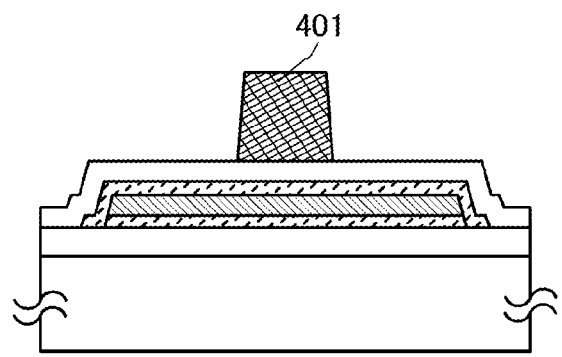

Next, the gate electrode layer 401 is formed over the gate insulating film 402 by a plasma CVD method, a sputtering method, or the like (see FIG. 2D).

The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have either a single-layer structure or a layered structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, the gate electrode layer 401 may have a layered structure of the above conductive material and the above metal material.

As one layer of the gate electrode layer 401 which is in contact with the gate insulating film 402, a metal oxide containing nitrogen, specifically, an In—Ga—Zn-based oxide film containing nitrogen, an In—Sn-based oxide film containing nitrogen, an In—Ga-based oxide film containing nitrogen, an In—Zn-based oxide film containing nitrogen, a Sn-based oxide film containing nitrogen, an In-based oxide film containing nitrogen, or a metal nitride (e.g., InN or SnN) film can be used. Such a film has a work function of 5 eV or higher, preferably 5.5 eV or higher, and use of this film as the gate electrode layer enables the threshold voltage of electrical characteristics of a transistor to be a positive value. Accordingly, a so-called normally-off switching element can be obtained.

Next, the insulating film 407 is formed over the gate insulating film 402 and the gate electrode layer 401.

The insulating film 407 can be formed using a material similar to that of the gate insulating film 402.

As the insulating film 407, a planarization insulating film may be used. As the planarization insulating film, an organic material such as a polyimide-based resin, an acrylic-based resin, or a benzocyclobutene-based resin can be used. In addition to the above organic materials, a low-dielectric constant material (a low-k material) or the like can be used. Note that the planarization insulating film may be formed by stacking a plurality of insulating films formed using any of these materials.

Figure 2E:
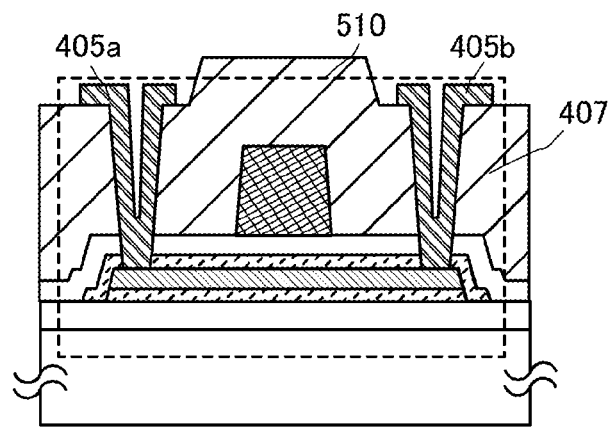

Next, contact holes (openings) reaching the oxide semiconductor layer 102 are formed in the insulating film 407, and the source electrode layer 405a and the drain electrode layer 405b electrically connected to the oxide semiconductor layer 102 are formed in the respective contact holes (see FIG. 2E).

As the conductive film used for forming the source electrode layer and the drain electrode layer, it is possible to use, for example, a metal film containing an element selected from Al, Cr, Cu, Ta, Ti, Mo, or W, a metal nitride film containing any of these elements as its component (a titanium nitride film, a molybdenum nitride film, or a tungsten nitride film), or the like. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Further, a dopant such as phosphorus or boron may be added to the conductive film used for forming the source electrode layer 405a and the drain electrode layer 405b.

Through the above steps, the transistor 510 can be formed.

FIGS. 3A and 3B and FIGS. 4A to 4C illustrate structures of a transistor according to this embodiment, which are different from that of the transistor 510. The transistors illustrated in FIGS. 3A and 3B and FIGS. 4A to 4C are just partly different from the transistor 510 described above; thus, the same reference numerals are used to denote the same portions for simplification, and detailed description of the same portion is omitted in this embodiment.

Figure 3A:
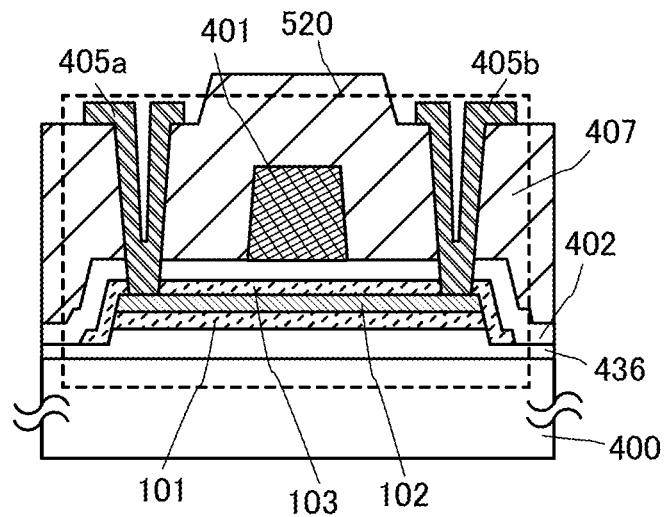
FIGS. 3A and 3B are cross-sectional views each illustrating one embodiment of a semiconductor device.

A transistor 520 illustrated in FIG. 3A has a structure in which part of the oxide insulating film 436 is etched to be thin with the use of a mask which is used for processing the first buffer film 101a and the oxide semiconductor film 102a into island shapes (or with the use of the island-shaped first buffer layer 101 and oxide semiconductor layer 102 which are manufactured by the processing, as a mask). In the transistor 520, a region of the oxide insulating film 436 which overlaps with the island-shaped first buffer layer 101 and oxide semiconductor layer 102 has a larger thickness than the other regions of the oxide insulating film 436 (which do not overlap with the island-shaped first buffer layer 101 and oxide semiconductor layer 102). By etching part of the oxide insulating film 436 at the time of processing for forming the island-shaped first buffer layer 101 and oxide semiconductor layer 102, an etching residue of the oxide semiconductor layer 102 or the like is removed, and thus generation of leakage current can be prevented.

Figure 3B:
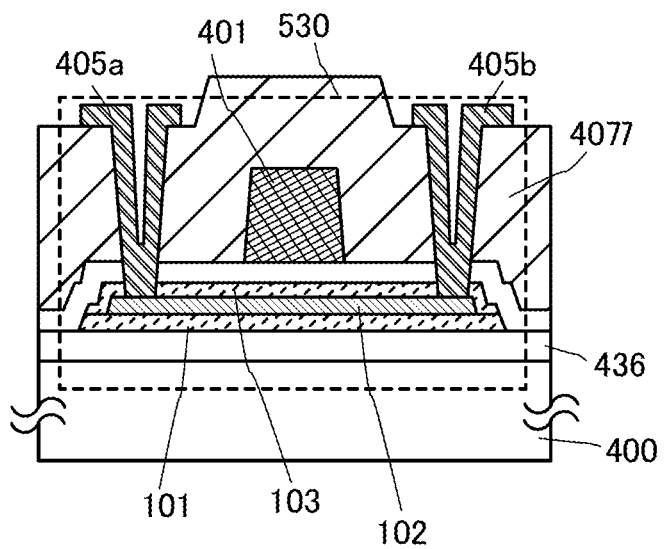

A transistor 530 illustrated in FIG. 3B has a structure in which the first buffer layer 101, the oxide semiconductor layer 102, and the second buffer layer 103 are formed so as to have island shapes through three photolithography steps. The island-shaped first buffer layer 101, oxide semiconductor layer 102, and second buffer layer 103 in the transistor 530 are formed in the following manner: after the first buffer film 101a is formed, the island-shaped first buffer layer 101 is formed with the use of a first mask; after the oxide semiconductor film 102a is formed over the island-shaped first buffer layer 101, the island-shaped oxide semiconductor layer 102 is formed with the use of a second mask; and after a second buffer film 103a which is to be the second buffer layer 103 is formed over the island-shaped first buffer layer 101 and oxide semiconductor layer 102, the second buffer film 103a is processed into an island shape with the use of a third mask.

In the transistor 530, a side surface of the first buffer layer 101 extends beyond a side surface of the oxide semiconductor layer 102, and the second buffer layer 103 is in contact with part of a top surface of the first buffer layer 101. An end portion of the second buffer layer 103 is in contact with and overlaps with an end portion of the first buffer layer 101.

Figure 4A:
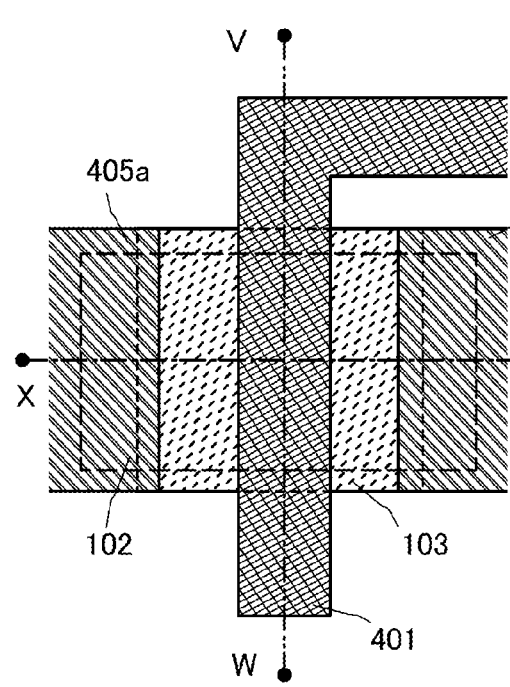
FIGS. 4A to 4C are a plan view and cross-sectional views illustrating one embodiment of a semiconductor device.
Figure 4C:
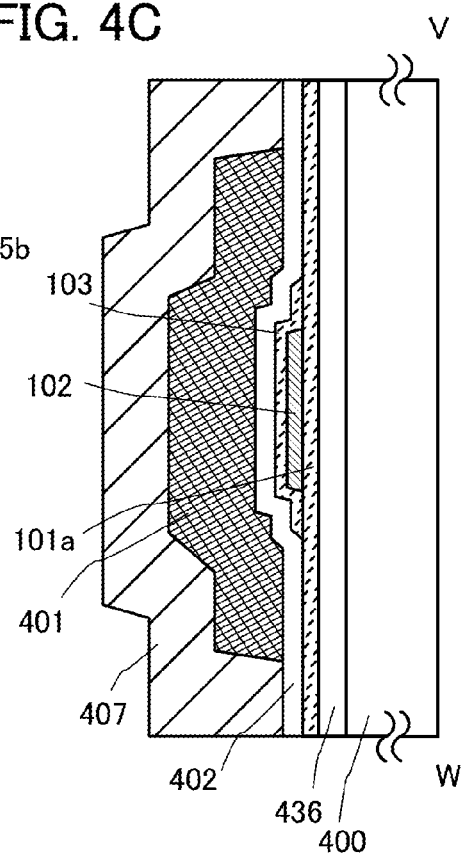
Figure 4B:
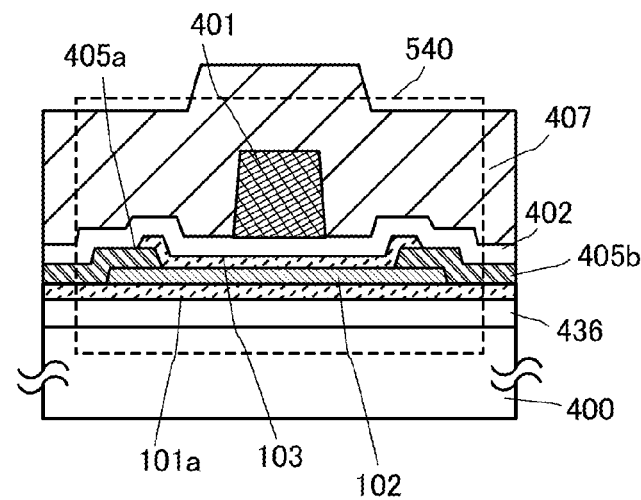

FIGS. 4A to 4C illustrate a structure of a transistor 540. FIG. 4A is a plan view, FIG. 4B is a cross-sectional view taken along chain line X-Y in FIG. 4A, and FIG. 4C is a cross-sectional view taken along chain line V-W in FIG. 4A.

As illustrated in the cross-sectional view in the channel length direction in FIG. 4B, the transistor 540 includes the first buffer film 101a, the island-shaped oxide semiconductor layer 102 provided over the first buffer film 101a, the source electrode layer 405a and the drain electrode layer 405b provided on and in contact with the oxide semiconductor layer 102, the second buffer layer 103 provided over the source electrode layer 405a and the drain electrode layer 405b and in contact with at least a channel formation region of the oxide semiconductor layer 102, the gate insulating film 402, and the gate electrode layer 401. In the transistor 540, the insulating film 407 may be provided over the gate electrode layer 401.

As illustrated in the cross-sectional view in the channel width direction in FIG. 4C, in a cross section in the channel width direction of the transistor 540, a side surface of the oxide semiconductor layer 102 is covered with an end portion of the second buffer layer 103. With such a structure, generation of a parasitic channel between the oxide semiconductor layer 102 and the gate electrode layer 401 can be prevented.

In the transistor 540 illustrated in FIGS. 4B and 4C, the second buffer layer 103 is provided so as to cover the source electrode layer 405a and the drain electrode layer 405b, and to be in contact with the first buffer film 101a and the oxide semiconductor layer 102. That is, the oxide semiconductor layer 102 is surrounded by the first buffer layer 101a and the second buffer layer 103. As in the transistor 510 or the like, the first buffer layer 101 may be formed by processing the first buffer film 101a into an island shape.

The first buffer film 101a and the second buffer layer 103 may be formed using the same material, or different materials selected from those described above. In the case where the first buffer film 101a and the second buffer layer 103 are formed using the same material (or materials with which sufficient etching selectivity cannot be obtained), the etching for processing the second buffer layer 103 into an island shape may be controlled by adjusting the etching time. When the second buffer layer 103 is formed by the processing, part of the first buffer film 101a might be etched and thus the thickness of a region where the first buffer film 101a does not overlap with the second buffer layer 103 might be smaller than that of a region where the first buffer film 101a overlaps with the second buffer layer 103.

In each of the transistors described in this embodiment, the buffer layer containing a constituent similar to that of the oxide semiconductor layer is provided on and in contact with the top surface and the bottom surface of the oxide semiconductor layer. By providing the buffer layer containing a material compatible with the oxide semiconductor layer in contact with the oxide semiconductor layer in this manner, the interface between the buffer layer and the oxide semiconductor layer can be made favorable. Thus, charge or the like generated due to the operation of a semiconductor device can be prevented from being trapped at the interface between the oxide semiconductor layer and the buffer layer. With such a structure, the oxide semiconductor layer can be less adversely affected by charge, which suppresses shift of the threshold value of the transistor due to trapping of charge at the interface of the oxide semiconductor layer.

In the case where the oxide semiconductor layer is a crystalline oxide semiconductor layer, the buffer layer containing a constituent similar to that of the oxide semiconductor layer, which is provided in contact with the oxide semiconductor layer, enables the crystallinity in the vicinity of the interface between the oxide semiconductor layer and the buffer layer to be improved. Therefore, crystalline regions can be formed at the interface between the oxide semiconductor layer and the buffer layer which are in contact with each other and in the bulk, and thus the level in a band of the crystalline oxide semiconductor layer can be reduced. Consequently, the transistor characteristics can be improved.

With the use of such a crystalline oxide semiconductor layer for a transistor, it is possible to provide a highly reliable semiconductor device in which changes of the electrical characteristics of the transistor due to irradiation with visible light or ultraviolet light can be suppressed.

In this embodiment, the oxide semiconductor layer used for the active layer of the transistor is an oxide semiconductor layer highly purified to be i-type (intrinsic) by removing impurities such as hydrogen, moisture, a hydroxyl group, and hydride (also referred to as a hydrogen compound) from the oxide semiconductor by heat treatment and supplying oxygen which is a major constituent of the oxide semiconductor and is simultaneously reduced in a step of removing impurities. The transistor including the oxide semiconductor layer highly purified in such a manner has electrical characteristics which are less likely to change, and thus is electrically stable.

As described above, a semiconductor device formed using an oxide semiconductor, which has stable electrical characteristics, can be provided. Accordingly, a semiconductor device with high reliability can be provided.

The structures, methods, and the like described in this embodiment can be combined as appropriate with any of the structures, methods, and the like described in the other embodiments.

Embodiment 2

In this embodiment, another embodiment of a semiconductor device and a method of manufacturing the semiconductor device will be described with reference to FIGS. 5A to 5C. In this embodiment, the same portions as those in Embodiment 1 and portions having functions similar to those in Embodiment 1 and the same steps as those in Embodiment 1 and steps similar to those in Embodiment 1 may be handled as in Embodiment 1, and repeated description is omitted. In addition, detailed description of the same portions is not repeated.

This embodiment shows an example in which in a method of manufacturing a semiconductor device according to one embodiment of the disclosed invention, oxygen (including at least one of an oxygen radical, an oxygen atom, and an oxygen ion) is introduced into an oxide semiconductor layer that has been subjected to dehydration or dehydrogenation treatment so that oxygen is supplied to the oxide semiconductor layer.

Through the dehydration or dehydrogenation treatment, oxygen that is a main component material of an oxide semiconductor might be eliminated and thus might be reduced. There is an oxygen deficiency in a portion where oxygen is eliminated in the oxide semiconductor layer and a donor level which causes variation in the electrical characteristics of a transistor is formed owing to the oxygen deficiency.

Thus, oxygen is preferably supplied to the oxide semiconductor layer which has been subjected to the dehydration or dehydrogenation treatment. By supply of oxygen to the oxide semiconductor layer, oxygen deficiency in the oxide semiconductor layer can be filled. With the use of the oxide semiconductor layer for a transistor, a fluctuation in the threshold voltage Vth of the transistor and a shift of the threshold voltage Vth of the transistor due to oxygen deficiency can be reduced. Further, the threshold voltage of the transistor can be positively shifted to make the transistor normally off.

Figure 5A:
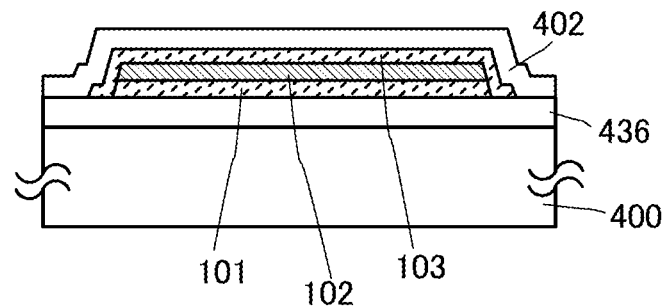
FIGS. 5A to 5C illustrate an example of a manufacturing process of a semiconductor device.

FIG. 5A corresponds to FIG. 2C, in which the first buffer layer 101, the oxide semiconductor layer 102, the second buffer layer 103, and the gate insulating film 402 are formed over the substrate 400 having an insulating surface on which the oxide insulating film 436 is provided.

Figure 5B:
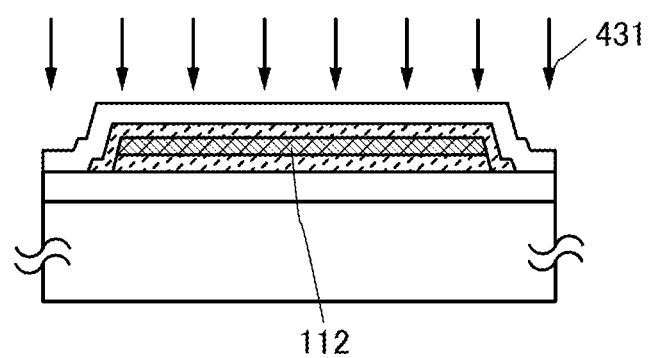
Figure 5C:
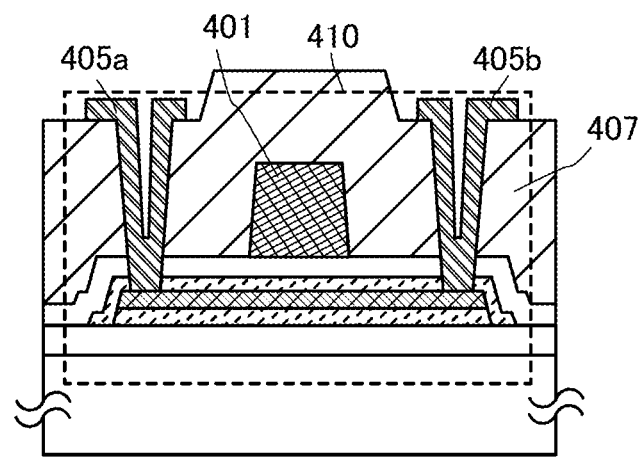

Next, oxygen 431 (including at least one of an oxygen radical, an oxygen atom, and an oxygen ion) is added to the oxide semiconductor layer 102; thus, oxygen is supplied to the oxide semiconductor layer 102 so that an oxygen-excess region 112 is formed in the oxide semiconductor layer 102 (see FIG. 5B).

The oxygen-excess region 112 at least partly includes a region containing oxygen in excess of the stoichiometric ratio in the oxide semiconductor in a crystalline state. Oxygen deficiency in the oxide semiconductor layer 102 or at an interface of the oxide semiconductor layer 102 can be filled with the oxygen 431 supplied to the oxygen-excess region 112. Note that in the step of adding oxygen to the oxide semiconductor layer 102, an oxygen-excess region may be formed in the first buffer layer 101 or/and the second buffer layer 103 in contact with the oxide semiconductor layer 102.

Next, the gate electrode layer 401 is formed in a region overlapping with the oxide semiconductor layer 102 which includes the oxygen-excess region 112. After that, the insulating film 407 is formed over the gate insulating film 402 and the gate electrode layer 401, and the source electrode layer 405a and the drain electrode layer 405b are formed so as to be electrically connected to the oxide semiconductor layer 102 through contact holes provided in the insulating film 407. Through these steps, a transistor 410 is manufactured (see FIG. 5C).

In the transistor described in this embodiment, oxygen is added to the dehydrated or dehydrogenated oxide semiconductor layer 102 to be supplied thereto, so that the oxide semiconductor layer 102 can be highly purified and be i-type (intrinsic). Variation in the electrical characteristics of the transistor 410 including the highly purified and i-type (intrinsic) oxide semiconductor layer 102 is suppressed and the transistor 410 is thus electrically stable.

Oxygen can be added by an ion implantation method, an ion doping method, a plasma immersion ion implantation method, plasma treatment, or the like.

Although the step of adding the oxygen 431 to the oxide semiconductor layer 102 through the gate insulating film 402 is described in this embodiment, there is no particular limitation on the timing of the addition of oxygen to the oxide semiconductor layer 102 as long as it is performed after the dehydration or dehydrogenation treatment. Further, oxygen may be added plural times to the oxide semiconductor layer 102 after the dehydration or dehydrogenation treatment is performed. For example, the oxygen 431 may be added in the state where the oxide semiconductor layer 102 is exposed, or oxygen may be added to the oxide semiconductor layer 102 through the insulating film 407. Note that in the case where the oxygen 431 is added in the state where the oxide semiconductor layer 102 is exposed, plasma treatment can also be used.

Further, in the oxygen-excess region 112 of the oxide semiconductor layer 102, the concentration of oxygen added through the step of adding oxygen is preferably higher than or equal to $1\times10^{18}/cm^3$ and lower than or equal to $5\times10^{21}/cm^3$.

In the oxide semiconductor, oxygen is one of main component materials. Thus, it is difficult to accurately estimate the oxygen concentration in the oxide semiconductor layer 102 by a method such as secondary ion mass spectrometry (SIMS). In other words, it can be said that it is hard to determine whether or not oxygen is intentionally added to the oxide semiconductor layer 102.

It is known that there are isotopes of oxygen, such as $^{17}O$ and $^{18}O$, and the proportions of $^{17}O$ and $^{18}O$ in all of the oxygen atoms in nature are 0.037% and 0.204%, respectively. That is to say, it is possible to measure the concentrations of these isotopes in the oxide semiconductor layer 102 by a method such as SIMS; therefore, the oxygen concentration in the oxide semiconductor layer 102 may be able to be estimated more accurately by measuring the concentration of such an isotope. Thus, the concentration of the isotope may be measured to determine whether or not oxygen is intentionally added to the oxide semiconductor layer 102.

Heat treatment is preferably performed after oxygen is added to the oxide semiconductor film. As the preferable heating conditions, the heating temperature is higher than or equal to 250° C. and lower than or equal to 700° C., more preferably higher than or equal to 300° C. and lower than or equal to 450° C., and the heating atmosphere is an oxygen atmosphere. Alternatively, the heat treatment may be performed under a nitrogen atmosphere, reduced pressure, or the air (ultra-dry air).

In the case where the oxide semiconductor layer is a crystalline oxide semiconductor layer, part of the crystalline oxide semiconductor layer might become amorphous by the addition of the oxygen 431. In this instance, the crystallinity of the oxide semiconductor layer can be recovered by performing heat treatment after the addition of the oxygen 431.

As described above, a semiconductor device formed using an oxide semiconductor layer, which has stable electrical characteristics, can be provided. Accordingly, a semiconductor device with high reliability can be provided.

The structures, methods, and the like described in this embodiment can be combined as appropriate with any of the structures, methods, and the like described in the other embodiments.

Embodiment 3

In this embodiment, another embodiment of a semiconductor device and a method of manufacturing the semiconductor device will be described with reference to FIGS. 6A to 6C. In this embodiment, the same portions as those in the above embodiment and portions having functions similar to those in the above embodiment and the same steps as those in the above embodiment and steps similar to those in the above embodiment may be handled as in the above embodiment, and repeated description is omitted. In addition, detailed description of the same portions is not repeated.

Described in this embodiment is an example in which low-resistance regions are formed in an oxide semiconductor layer in a method of manufacturing a semiconductor device according to one embodiment of the disclosed invention. The low-resistance regions can be formed by adding an impurity (also called a dopant) for changing the electrical conductivity to the oxide semiconductor layer.

As in the manufacturing process described in Embodiment 1, the first buffer layer 101, the oxide semiconductor layer 102, the second buffer layer 103, the gate insulating film 402, and the gate electrode layer 401 are formed over the substrate 400 having an insulating surface on which the oxide insulating film 436 is provided.

Figure 6A:
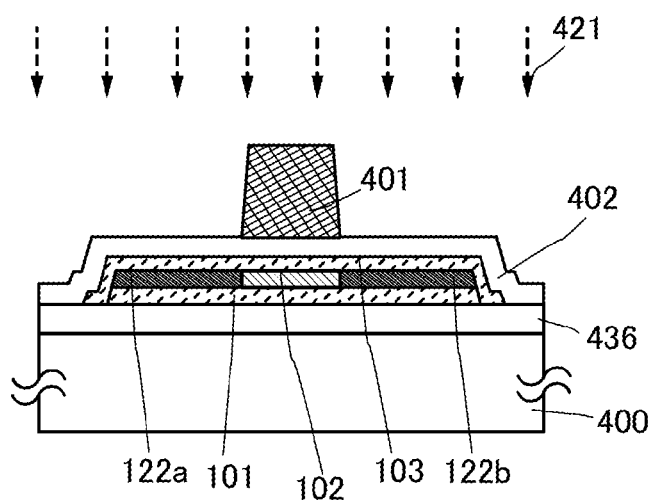
FIGS. 6A to 6C illustrate embodiments of a semiconductor device and an example of a manufacturing step thereof.

Next, a dopant 421 is selectively added to the oxide semiconductor layer 102 through the gate insulating film 402 and the second buffer layer 103 with the use of the gate electrode layer 401 as a mask, so that low-resistance regions 122a and 122b are formed (see FIG. 6A).

The dopant 421 is an impurity for changing the electrical conductivity of the oxide semiconductor layer 102. As the dopant 421, one or more selected from a Group 15 element (typically, phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn) can be used.

In this embodiment, the dopant 421 is added to the oxide semiconductor layer 102 through the gate insulating film 402 and the second buffer layer 103 by an implantation method. The dopant 421 can be added by an ion implantation method, an ion doping method, a plasma immersion ion implantation method, or the like. In that case, it is preferable to use a single ion of the dopant 421 or a fluoride ion or a chloride ion thereof.

The addition of the dopant 421 may be controlled by appropriately setting implantation conditions such as acceleration voltage and a dose, the thicknesses of the gate insulating film 402 and the second buffer layer 103 through which the dopant 421 passes, and the like. In this embodiment, boron is used as the dopant 421, and boron ions are implanted by an ion implantation method. Note that the dose of the dopant 421 may be greater than or equal to $1 \times 10^{13}$ ions/cm$^2$ and less than or equal to $5 \times 10^{16}$ ions/cm$^2$.

The concentration of the dopant 421 in the low-resistance region 122a and that in the low-resistance region 122b are preferably higher than or equal to $5 \times 10^{18}$/cm$^3$ and lower than or equal to $1 \times 10^{22}$/cm$^3$.

The addition of the dopant 421 may be performed while the substrate 400 is heated.

The addition of the dopant 421 to the oxide semiconductor layer 102 may be performed plural times, and plural kinds of dopant may be used.

Depending on how deep the dopant 421 is added, the dopant 421 is included and a pair of low-resistance regions is formed also in a region of the first buffer layer 101 or the second buffer layer 103 which does not overlap with the gate electrode layer 401.

After the dopant 421 is added, heat treatment may be performed. As the preferable heating conditions, the heating temperature is higher than or equal to 300° C. and lower than or equal to 700° C., more preferably higher than or equal to 300° C. and lower than or equal to 450° C., the heating time is one hour, and the heating atmosphere is an oxygen atmosphere. Alternatively, the heat treatment may be performed under a nitrogen atmosphere, reduced pressure, or the air (ultra-dry air).

In the case where the oxide semiconductor layer 102 is a crystalline oxide semiconductor film, part of the crystalline oxide semiconductor film might become amorphous by the addition of the dopant 421. In this instance, the crystallinity of the oxide semiconductor layer 102 can be recovered by performing heat treatment after the addition of the dopant 421.

Figure 6B:
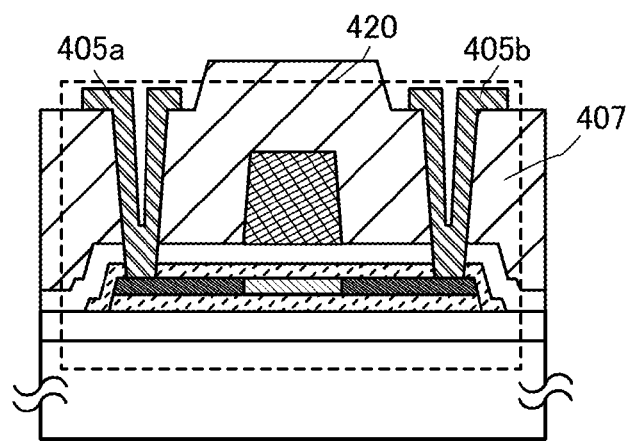

Next, the insulating film 407 is formed over the gate insulating film 402 and the gate electrode layer 401, and the source electrode layer 405a and the drain electrode layer 405b are formed so as to be electrically connected to the oxide semiconductor layer 102 through contact holes provided in the insulating film 407 (see FIG. 6B).

Through the above steps, a transistor 420 according to this embodiment can be manufactured. The oxide semiconductor layer 102 in the transistor 420 includes the low-resistance regions 122a and 122b between which a channel formation region overlapping with the gate electrode layer 401 is sandwiched.

Figure 6C:
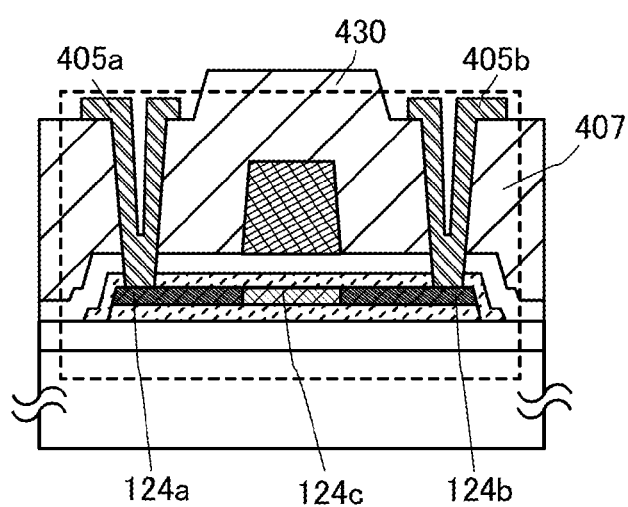

FIG. 6C illustrates a transistor 430 having a structure in which a dopant is added to the transistor 410 including the oxygen-excess region of Embodiment 2 and thus low-resistance regions are formed.

After the oxide semiconductor layer 102 including the oxygen-excess region 112 is formed through the steps illustrated in FIGS. 5A and 5B, a dopant is added with the use of the gate electrode layer 401 as a mask; thus, the transistor 430 includes low-resistance regions 124a and 124b including the dopant and excess oxygen, between which a channel formation region 124c including excess oxygen is sandwiched.

With an oxide semiconductor layer including low-resistance regions between which a channel formation region is sandwiched in the channel length direction, the transistors 420 and 430 described in this embodiment have excellent on characteristics (e.g., on-state current and field-effect mobility) and enable high-speed operation and high-speed response. Further, the low-resistance regions are formed in a self-aligned manner and do not overlap with the gate electrode layer; thus, parasitic capacitance can be reduced. A reduction in parasitic capacitance leads to lowering of power consumption of the whole semiconductor device.

The structures, methods, and the like described in this embodiment can be combined as appropriate with any of the structures, methods, and the like described in the other embodiments.

Embodiment 4

A semiconductor device with a display function (also referred to as display device) can be manufactured using any of the transistors described in Embodiments 1 to 3. Moreover, some or all of the driver circuits which include the transistors can be formed over a substrate where the pixel portion is formed, whereby a system-on-panel can be obtained.

Figure 7A:
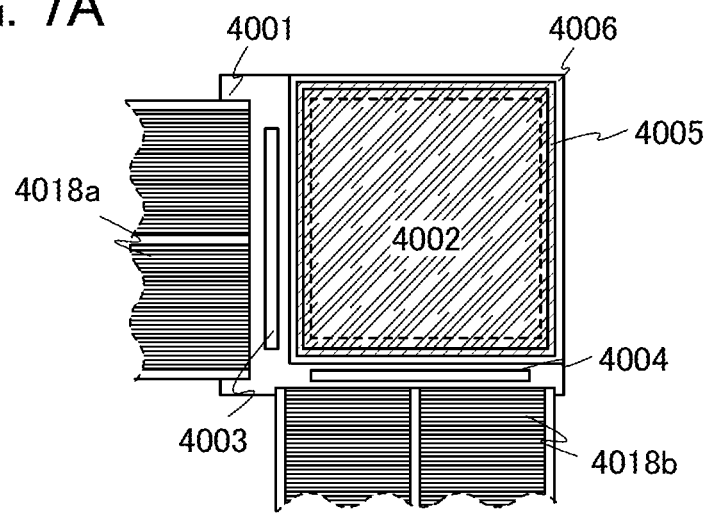
FIGS. 7A to 7C each illustrate one embodiment of a semiconductor device.

In FIG. 7A, a sealant 4005 is provided so as to surround a pixel portion 4002 provided over a first substrate 4001, and the pixel portion 4002 is sealed between the first substrate 4001 and a second substrate 4006. In FIG. 7A, a signal line driver circuit 4003 and a scan line driver circuit 4004 which are formed using a single crystal semiconductor film or a polycrystalline semiconductor film over a substrate separately prepared are mounted over the first substrate 4001, in a region that is different from the region surrounded by the sealant 4005. Various signals and potentials which are provided to the pixel portion 4002 through the signal line driver circuit 4003 and the scan line driver circuit 4004 are supplied from flexible printed circuits (FPCs) 4018a and 4018b.

Figure 7B:
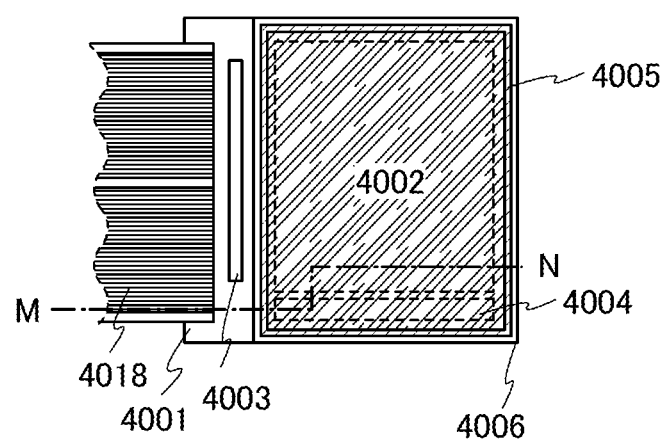
Figure 7C:
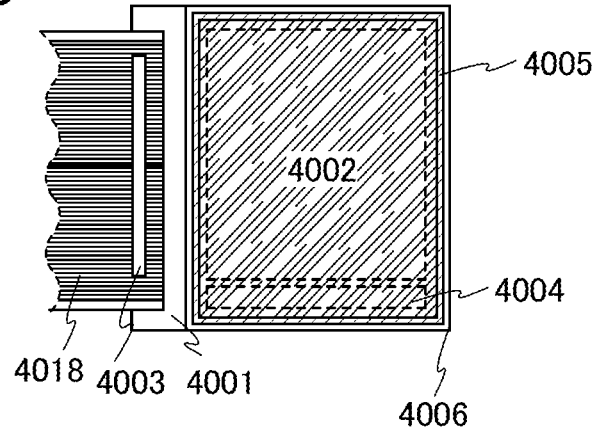

In FIGS. 7B and 7C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 7B and 7C, the signal line driver circuit 4003 which is formed using a single crystal semiconductor film or a polycrystalline semiconductor film over a substrate separately prepared is mounted over the first substrate 4001, in a region that is different from the region surrounded by the sealant 4005. In FIGS. 7B and 7C, various signals and potentials which are provided to the pixel portion 4002 through the signal line driver circuit 4003 and the scan line driver circuit 4004 are supplied from an FPC 4018.

Although FIGS. 7B and 7C each illustrate an example in which the signal line driver circuit 4003 is formed separately and mounted on the first substrate 4001, the display device according to the present invention is not limited to this structure. The scan line driver circuit may be separately formed and then mounted, or only part of the signal line driver circuit or only part of the scan line driver circuit may be separately formed and then mounted.

Note that there is no particular limitation on a connection method of a separately formed driver circuit, and a chip on glass (COG) method, a wire bonding method, a tape automated bonding (TAB) method or the like can be used. FIG. 7A illustrates an example in which the signal line driver circuit 4003 and the scan line driver circuit 4004 are mounted by a COG method. FIG. 7B illustrates an example in which the signal line driver circuit 4003 is mounted by a COG method. FIG. 7C illustrates an example in which the signal line driver circuit 4003 is mounted by a TAB method.

Note that the display device includes a panel in which the display element is sealed, and a module in which an IC and the like including a controller are mounted on the panel.

Specifically, a display device in this specification means an image display device, a display device, or a light source (including a lighting device). Furthermore, the display device also includes not only a panel in which the display element is sealed but also the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and any of the transistors described in Embodiments 1 to 3 can be applied thereto.

As the display element provided in the display device, a liquid crystal element (also referred to as liquid crystal display element) or a light-emitting element (also referred to as light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as an electronic ink display device (electronic paper), can be used.

Embodiments of the semiconductor device will be described with reference to FIGS. 7A to 7C and FIGS. 8A and 8B. FIGS. 8A and 8B correspond to cross-sectional views taken along line M-N in FIG. 7B.

As illustrated in FIGS. 7A to 7C and FIGS. 8A and 8B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source electrode layers and drain electrode layers of transistors 4010 and 4011.

Each of the pixel portion 4002 and the scan line driver circuit 4004 which are provided over the first substrate 4001 includes a plurality of transistors. In FIG. 8A, the transistor 4010 included in the pixel portion 4002 and the transistor 4011 included in the scan line driver circuit 4004 are illustrated as an example. Further, in FIG. 8B, the transistor 4010 included in the pixel portion 4002 and the transistor 4011 included in the scan line driver circuit 4004 are illustrated as an example. In FIG. 8A, an insulating film 4020 is provided over the transistors 4010 and 4011, and in FIG. 8B, insulating films 4020 and 4021 are provided over the transistors 4010 and 4011. Note that an insulating film 4023 is an insulating film serving as a base film.

Any of the transistors described in Embodiments 1 to 3 can be applied to the transistor 4010 and the transistor 4011. Described in this embodiment is an example in which a transistor having a structure similar to that of the transistor 510 described in Embodiment 1 is used. Variation in the electrical characteristics of the transistors 4010 and 4011 is suppressed and the transistors 4010 and 4011 are electrically stable. As described above, a semiconductor device with high reliability can be provided as the semiconductor device in this embodiment. The transistors 4010 and 4011 include a first buffer film 4040.

The transistor 4010 included in the pixel portion 4002 is electrically connected to a display element to form a display panel. There is no particular limitation on the kind of display element as long as display can be performed, and a variety of kinds of display elements can be employed.

An example of a liquid crystal display device using a liquid crystal element as a display element is shown in FIG. 8A. In FIG. 8A, a liquid crystal element 4013 includes the first electrode layer 4030, a second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating film and is provided in order to control the thickness of the liquid crystal layer 4008 (a cell gap). Alternatively, a spherical spacer may also be used.

In the case where a liquid crystal element is used as the display element, a thermotropic liquid crystal, a ferroelectric liquid crystal, an anti-ferroelectric liquid crystal, or the like can be used. These liquid crystals may be a low molecular compound or a high molecular compound. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved.

The specific resistivity of the liquid crystal material is higher than or equal to $1 \times 10^9$ $\Omega \cdot cm$, preferably higher than or equal to $1 \times 10^{11}$ $\Omega \cdot cm$, further preferably higher than or equal to $1 \times 10^{12}$ $\Omega \cdot cm$. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using a transistor including an oxide semiconductor layer, which is disclosed in this specification, it is enough to provide a storage capacitor having a capacitance that is ⅓ or less, preferably ⅕ or less of liquid crystal capacitance of each pixel.

In the transistor including an oxide semiconductor layer, which is disclosed in this specification, the current in an off state (off-state current) can be made small. Accordingly, an electric signal such as an image signal can be held for a longer period, and a writing interval can be set longer. Accordingly, the frequency of refresh operation can be reduced, which leads to an effect of suppressing power consumption.

The transistor including an oxide semiconductor layer, which is disclosed in this specification, can have relatively high field-effect mobility; thus, the scan line driver circuit 4004 can operate at high speed. According to this embodiment, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as organic EL element, and the latter is referred to as inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as current-excitation light-emitting element. Note that an example of an organic EL element is described here as a light-emitting element.

In order to extract light emitted from the light-emitting element, at least one of the pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

An example of a light-emitting device including a light-emitting element as a display element is illustrated in FIG. 8B. A light-emitting element 4513 is electrically connected to the transistor 4010 provided in the pixel portion 4002. A structure of the light-emitting element 4513 illustrated in FIG. 8B is not limited to the illustrated layered structure including the first electrode layer 4030, an electroluminescent layer 4511, and the second electrode layer 4031. The structure of the light-emitting element 4513 can be changed as appropriate depending on the direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed.

Further, a layer containing an organic compound may be deposited by an evaporation method to cover the light-emitting element 4513 so that oxygen, hydrogen, moisture, carbon dioxide, and the like do not enter the light-emitting element 4513.

In addition, in a space which is formed with the first substrate 4001, the second substrate 4006, and the sealant 4005, a filler 4514 is provided for sealing. In this manner, the light-emitting element 4513 and the like are preferably packaged (sealed) with a protective film (such as a laminate film or an ultraviolet curable resin film) or a cover material with high air-tightness and little degasification so that the light-emitting element 4513 and the like are not exposed to the outside air.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate copolymer (EVA) can be used.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also referred to as electrophoretic display device (electrophoretic display) and is advantageous in that it has the same level of readability as plain paper, it has lower power consumption than other display devices, and it can be made thin and lightweight.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless).

A solution in which the above microcapsules are dispersed in a solvent is referred to as electronic ink. Furthermore, by using a color filter or particles that have a pigment, color display can also be achieved.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

Note that in FIGS. 7A to 7C and FIGS. 8A and 8B, a flexible substrate as well as a glass substrate can be used as the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is interposed between PVF films or polyester films can be used.

In this embodiment, an aluminum oxide film is used as the insulating film 4020. In this embodiment, the aluminum oxide film provided as the insulating film 4020 over the oxide semiconductor layer has a high shielding effect (blocking effect) of preventing penetration of both oxygen and impurities such as hydrogen and moisture. Therefore, in and after the manufacturing process, the aluminum oxide film functions as a protective film for preventing entry of an impurity such as hydrogen or moisture, which causes a change in characteristics, into the oxide semiconductor layer and release of oxygen, which is a main component material of the oxide semiconductor, from the oxide semiconductor layer.

Further, the insulating film 4021 functioning as a planarization insulating film can be formed using an organic material having heat resistance, such as an acrylic-, polyimide-, or benzocyclobutene-based resin, polyamide, or epoxy. Other than such organic materials, it is also possible to use a low-dielectric constant material (low-k material), a siloxane-based resin, phosphosilicate glass (PSG), borophosphosilicate glass (BPSG), or the like. Note that the insulating film may be formed by stacking a plurality of insulating films formed using any of these materials.

The first electrode layer and the second electrode layer (which may be called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A protection circuit for protecting the driver circuit may be provided. The protection circuit is preferably formed using a nonlinear element.

As described above, by using any of the transistors described in Embodiments 1 to 3, a semiconductor device with high reliability can be provided. Note that the transistor described in Embodiment 1 can be applied to semiconductor devices having a variety of functions, such as a power device which is mounted on a power supply circuit and a semiconductor integrated circuit like LSI.

This embodiment can be implemented in appropriate combination with any of the structures described in the other embodiments.

Embodiment 5

A semiconductor device having an image sensor function of reading data on an object can be manufactured using any of the transistors described in Embodiments 1 to 3.

FIG. 9A illustrates an example of a semiconductor device having an image sensor function. FIG. 9A is an equivalent circuit diagram of a photosensor, and FIG. 9B is a cross-sectional view illustrating part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

Note that in circuit diagrams in this specification, a transistor including an oxide semiconductor film is denoted by a symbol "OS" so that it can be identified as a transistor including an oxide semiconductor film. In FIG. 9A, the transistor 640 and the transistor 656 are each a transistor including an oxide semiconductor stack, to which any of the transistors described in Embodiments 1 to 3 can be applied. Described in this embodiment is an example in which a transistor having a structure similar to that of the transistor 540 described in Embodiment 2 is used.

FIG. 9B is a cross-sectional view of the photodiode 602 and the transistor 640 in the photosensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 631, an insulating film 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between electrode layers 641a and 641b formed over the interlayer insulating film 633 and an electrode layer 642 formed over the interlayer insulating film 634.

The electrode layer 641b is electrically connected to a conductive layer 643 formed over the interlayer insulating film 634, and the electrode layer 642 is electrically connected to an electrode layer 645 through the electrode layer 641a. The electrode layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$)

may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive film. Note that a surface on the n-type semiconductor film side can alternatively be used as the light-receiving plane.

With the use of an insulating material, the insulating film 632, the interlayer insulating film 633, and the interlayer insulating film 634 can be formed, depending on the material, using a method such as a sputtering method, a plasma CVD method, an SOG method, spin coating, dipping, spray coating, a droplet discharge method (such as an inkjet method), screen printing, or offset printing.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

The insulating film 632 can be formed using an inorganic insulating material and can have a single-layer structure or a layered structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

For a reduction in surface roughness, an insulating film functioning as a planarization insulating film is preferably used as each of the interlayer insulating films 633 and 634. For the interlayer insulating films 633 and 634, for example, an organic insulating material having heat resistance, such as polyimide, an acrylic resin, a benzocyclobutene resin, polyamide, or an epoxy resin, can be used. Other than such organic insulating materials, it is possible to use a single layer or stacked layers of any of low-dielectric constant materials (low-k material) such as a siloxane-based resin, phosphosilicate glass (PSG), and borophosphosilicate glass (BPSG).

With detection of light that enters the photodiode 602, data on an object to be detected can be read. Note that a light source such as a backlight can be used at the time of reading data on an object to be detected.

As described above, by using any of the transistors described in Embodiments 1 to 3, a semiconductor device with high reliability can be provided.

This embodiment can be implemented in appropriate combination with any of the structures described in the other embodiments.

Embodiment 6

A semiconductor device disclosed in this specification can be applied to a variety of electronic devices (including a game machine). Examples of electronic devices include a television set (also referred to as a television or a television receiver), a monitor of a computer, cameras such as a digital camera and a digital video camera, a digital photo frame, a mobile phone, a portable game machine, a portable information terminal, an audio reproducing device, a game console (e.g., a pachinko machine or a slot machine), a housing of a game machine, and the like. Specific examples of such electronic devices are illustrated in FIGS. 10A to 10D.

Figure 10A:
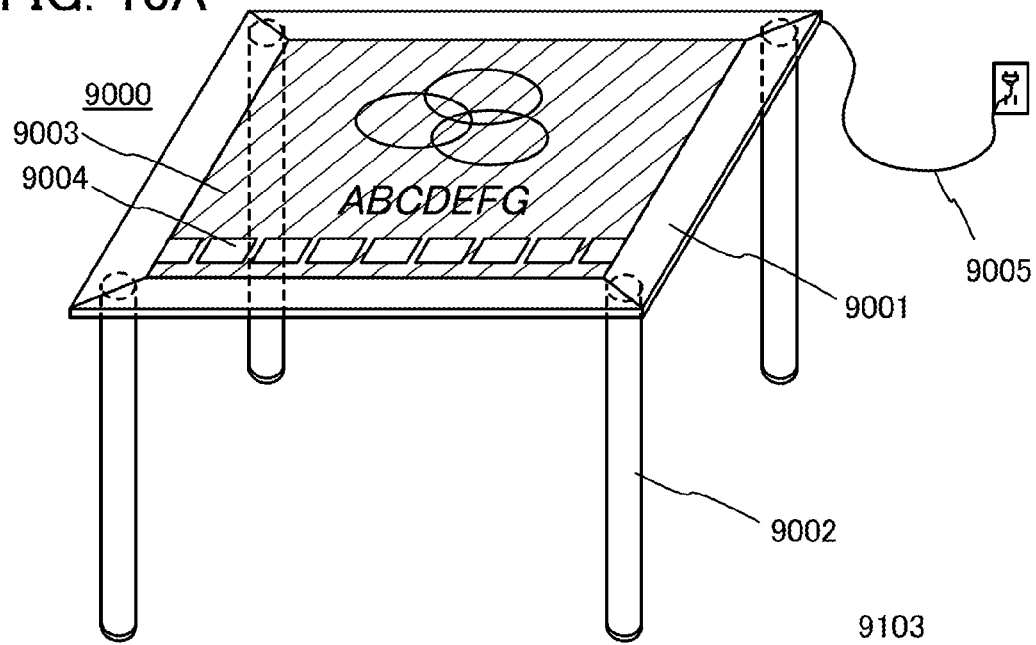
FIGS. 10A to 10D each illustrate an electronic device.

FIG. 10A illustrates a table 9000 having a display portion. In the table 9000, a display portion 9003 is incorporated into a housing 9001. A semiconductor device manufactured according to one embodiment of the present invention can be used for the display portion 9003, and an image can be displayed on the display portion 9003. Note that the housing 9001 is supported by four leg portions 9002. Further, a power cord 9005 for supplying power is provided for the housing 9001.

The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with the use of the semiconductor device having an image sensor function described in Embodiment 3, the display portion 9003 can function as a touch panel.

Further, the screen of the display portion 9003 can be placed perpendicular to a floor with a hinge provided for the housing 9001; thus, the table 9000 can also be used as a television set. A television set with a large screen takes up too much space that is available in a small room. However, with a table including a display portion therein, it is possible to make the use of the space in the room.

Figure 10B:
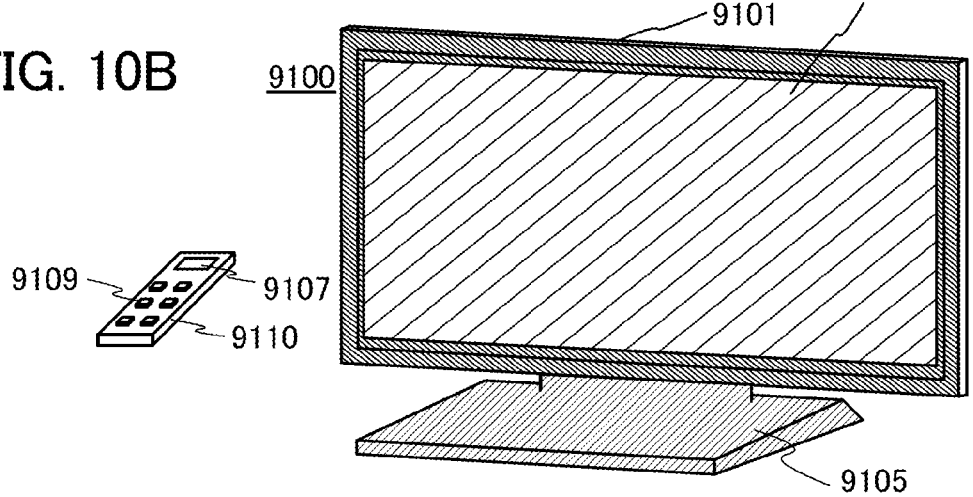

FIG. 10B illustrates a television set 9100. In the television set 9100, a display portion 9103 is incorporated in a housing 9101. A semiconductor device manufactured using one embodiment of the present invention can be used in the display portion 9103, so that an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 10B is provided with a receiver, a modem, and the like. With the receiver, the television set 9100 can receive a general television broadcast. Further, when the television set 9100 is connected to a communication network with or without wires connection via the modem, one-way (from a transmitter to a receiver) or two-way (between a transmitter and a receiver or between receivers) data communication can be performed.

By using the semiconductor device described in the above embodiment, a television set with high reliability can be provided.

Figure 10C:
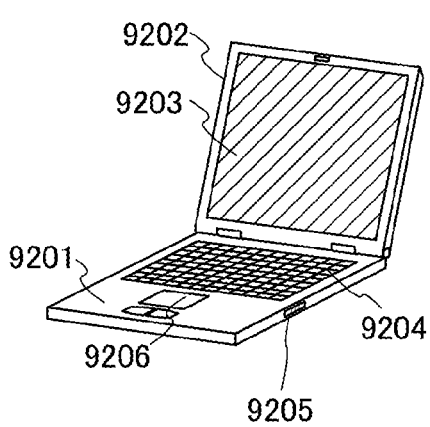

FIG. 10C illustrates a computer which includes a main body 9201, a housing 9202, a display portion 9203, a keyboard 9204, an external connection port 9205, a pointing device 9206, and the like. The computer includes a semiconductor device manufactured according to one embodiment of the present invention for the display portion 9203.

By using the semiconductor device described in the above embodiment, a computer with high reliability can be provided.

Figure 10D:
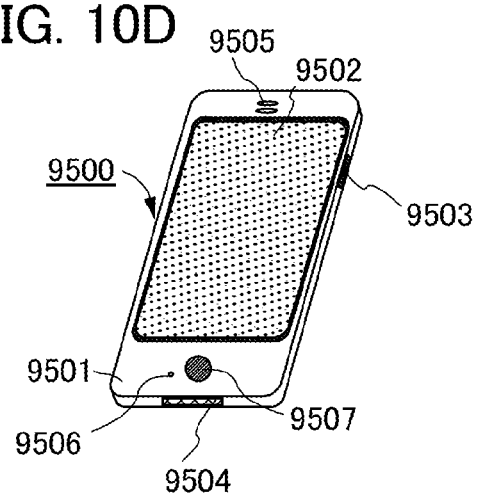

FIG. 10D illustrates an example of a mobile phone. A mobile phone 9500 is provided with a display portion 9502 incorporated in a housing 9501, operation buttons 9503 and 9507, an external connection port 9504, a speaker 9505, a microphone 9506, and the like. Note that the mobile phone 9500 is manufactured using a semiconductor device manufactured using one embodiment of the present invention for the display portion 9502.

Users can input data, make a call, or text a message by touching the display portion 9502 of the mobile phone 9500 illustrated in FIG. 10D with their fingers or the like.

There are mainly three screen modes for the display portion 9502. The first mode is a display mode mainly for displaying images. The second mode is an input mode mainly for inputting data such as text. The third mode is a display-and-input mode in which two modes of the display mode and the input mode are combined.

For example, in the case of making a call or text messaging, a text input mode mainly for inputting text is selected for the display portion 9502 so that characters displayed on a screen can be input. In this case, it is preferable to display a keyboard or number buttons on almost the entire screen of the display portion 9502.

By providing a detection device which includes a sensor for detecting inclination, such as a gyroscope or an acceleration sensor, inside the mobile phone 9500, the direction of the mobile phone 9500 (whether the mobile phone 9500 is placed horizontally or vertically for a landscape mode or a portrait mode) is determined so that display on the screen of the display portion 9502 can be automatically switched.

In addition, the screen mode is switched by touching the display portion 9502 or operating the operation button 9503 of the housing 9501. Alternatively, the screen modes can be switched depending on kinds of images displayed on the display portion 9502. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 9502 is not performed within a specified period of time while a signal detected by an optical sensor in the display portion 9502 is detected, the screen mode may be controlled so as to be switched from the input mode to the display mode.

The display portion 9502 can also function as an image sensor. For example, an image of a palm print, a fingerprint, or the like is taken by touching the display portion 9502 with the palm or the finger, whereby personal authentication can be performed. Further, by providing a backlight or a sensing light source which emits a near-infrared light in the display portion, an image of a finger vein, a palm vein, or the like can be taken.

The structures, methods, and the like described in this embodiment can be combined as appropriate with any of the structures, methods, and the like described in the other embodiments.

EXPLANATION OF REFERENCE

101: first buffer layer, 101a: first buffer film, 102: oxide semiconductor layer, 102a: oxide semiconductor film, 103: second buffer layer, 103a: second buffer film, 112: oxygen-excess region, 122a: low-resistance region, 122b: low-resistance region, 124a: low-resistance region, 124b: low-resistance region, 124c: channel formation region, 400: substrate, 401: gate electrode layer, 402: gate insulating film, 405a: source electrode layer, 405b: drain electrode layer, 407: insulating film, 410: transistor, 420: transistor, 421: dopant, 430: transistor, 431: oxygen, 436: oxide insulating film, 510: transistor, 520: transistor, 530:

transistor, 540: transistor, 601: substrate, 602: photodiode, 606*a*: semiconductor film, 606*b*: semiconductor film, 606*c*: semiconductor film, 608: adhesive layer, 613: substrate, 631: insulating film, 632: insulating film, 633: interlayer insulating film, 634: interlayer insulating film, 640: transistor, 641*a*: electrode layer, 641*b*: electrode layer, 642: electrode layer, 643: conductive layer, 645: electrode layer, 656: transistor, 658: photodiode reset signal line, 659: gate signal line, 671: photosensor output signal line, 672: photosensor reference signal line, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4019: anisotropic conductive film, 4020: insulating film, 4021: insulating film, 4023: insulating film, 4030: electrode layer, 4031: electrode layer, 4032: insulating film, 4033: insulating film, 4040: first buffer film, 4510: partition wall, 4511: electroluminescent layer, 4513: light-emitting element, 4514: filler, 9000: table, 9001: housing, 9002: leg portion, 9003: display portion, 9004: displayed button, 9005: power cord, 9100: television set, 9101: housing, 9103: display portion, 9105: stand, 9107: display portion, 9109: operation key, 9110: remote controller, 9201: main body, 9202: housing, 9203: display portion, 9204: keyboard, 9205: external connection port, 9206: pointing device, 9500: mobile phone, 9501: housing, 9502: display portion, 9503: operation button, 9504: external connection port, 9505: speaker, 9506: microphone, and 9507: operation button This application is based on Japanese Patent Application serial no. 2011-152164 filed with Japan Patent Office on Jul. 8, 2011, the entire contents of which are hereby incorporated by reference.

The invention claimed is:

1. A semiconductor device comprising:
   a first insulating layer over a substrate;
   a first buffer layer over the first insulating layer;
   an oxide semiconductor layer over and in contact with the first buffer layer, the oxide semiconductor layer including a channel region;
   a second buffer layer in contact with side surfaces of the oxide semiconductor layer, wherein the side surfaces of the oxide semiconductor layer are opposed to each other in a channel length direction;
   a gate insulating film over the second buffer layer;
   a gate electrode over the gate insulating film;
   a second insulating layer over the gate electrode, the second insulating layer comprising a first opening and a second opening;
   a source electrode over the second insulating layer, the source electrode electrically connected to the oxide semiconductor layer through the first opening; and
   a drain electrode over the second insulating layer, the drain electrode electrically connected to the oxide semiconductor layer through the second opening,
   wherein the second buffer layer is in direct contact with a top surface of the oxide semiconductor layer and a top surface of the first buffer layer,
   wherein each of the first buffer layer and the second buffer layer comprises an oxide of one or more elements selected from a group comprising aluminum, gallium, zirconium, hafnium, and a rare earth element, and
   wherein the second buffer layer is a single layer.

2. The semiconductor device according to claim 1, wherein the oxide semiconductor layer has at least one region containing oxygen in excess of the stoichiometric ratio in a crystalline state.

3. The semiconductor device according to claim 1, wherein the oxide semiconductor layer is a crystalline semiconductor layer.

4. The semiconductor device according to claim 1,
   wherein the oxide semiconductor layer comprises a crystal part,
   wherein a c-axis of the crystal part is aligned in a direction parallel to a normal vector of a surface where the oxide semiconductor layer is formed or a normal vector of a surface of the oxide semiconductor layer.

5. The semiconductor device according to claim 1, wherein the oxide semiconductor layer comprises at least indium (In) or zinc (Zn).

6. The semiconductor device according to claim 1, wherein the oxide semiconductor layer includes low-resistance regions between which the channel region is sandwiched.

7. The semiconductor device according to claim 1, wherein an end portion of the second buffer layer and an end portion of the first buffer layer are aligned.

8. A semiconductor device comprising:
   an insulating layer;
   a first buffer layer over the insulating layer;
   an oxide semiconductor layer over and in contact with the first buffer layer, the oxide semiconductor layer including a channel region;
   a second buffer layer in contact with side surfaces of the oxide semiconductor layer, wherein the side surfaces of the oxide semiconductor layer are opposed to each other in a channel length direction,
   wherein the second buffer layer is in direct contact with a top surface of the oxide semiconductor layer and side surfaces of the first buffer layer, wherein the side surfaces of the first buffer layer are opposed to each other in the channel length direction,
   wherein each of the first buffer layer and the second buffer layer comprises an oxide of one or more elements selected from a group comprising aluminum, gallium, zirconium, hafnium, and a rare earth element,
   wherein the second buffer layer is a single layer, and
   wherein the second buffer layer is in direct contact with a top surface of the insulating layer.

9. The semiconductor device according to claim 8, wherein the oxide semiconductor layer has at least one region containing oxygen in excess of the stoichiometric ratio in a crystalline state.

10. The semiconductor device according to claim 8, wherein the oxide semiconductor layer is a crystalline semiconductor layer.

11. The semiconductor device according to claim 8,
    wherein the oxide semiconductor layer comprises a crystal part,
    wherein a c-axis of the crystal part is aligned in a direction parallel to a normal vector of a surface where the oxide semiconductor layer is formed or a normal vector of a surface of the oxide semiconductor layer.

12. The semiconductor device according to claim 8, wherein the oxide semiconductor layer comprises at least indium (In) or zinc (Zn).

13. The semiconductor device according to claim 8, wherein the oxide semiconductor layer includes low-resistance regions between which the channel region is sandwiched.

14. A semiconductor device comprising:
a first insulating layer over a substrate;
a first buffer layer over the first insulating layer;
an oxide semiconductor layer over and in contact with the first buffer layer, the oxide semiconductor layer including a channel region;
a second buffer layer in contact with side surfaces of the oxide semiconductor layer, wherein the side surfaces of the oxide semiconductor layer are opposed to each other in a channel length direction;
a gate insulating film over the second buffer layer;
a gate electrode over the gate insulating film;
a second insulating layer over the gate electrode, the second insulating layer comprising a first opening and a second opening;
a source electrode over the second insulating layer, the source electrode electrically connected to the oxide semiconductor layer through the first opening; and
a drain electrode over the second insulating layer, the drain electrode electrically connected to the oxide semiconductor layer through the second opening,
wherein the second buffer layer is in direct contact with a top surface of the oxide semiconductor layer and side surfaces of the first buffer layer, wherein the side surfaces of the first buffer layer are opposed to each other in the channel length direction,
wherein each of the first buffer layer and the second buffer layer comprises an oxide of one or more elements selected from a group comprising aluminum, gallium, zirconium, hafnium, and a rare earth element, and
wherein the second buffer layer is a single layer.

15. The semiconductor device according to claim 14, wherein the oxide semiconductor layer has at least one region containing oxygen in excess of the stoichiometric ratio in a crystalline state.

16. The semiconductor device according to claim 14, wherein the oxide semiconductor layer is a crystalline semiconductor layer.

17. The semiconductor device according to claim 14,
wherein the oxide semiconductor layer comprises a crystal part,
wherein a c-axis of the crystal part is aligned in a direction parallel to a normal vector of a surface where the oxide semiconductor layer is formed or a normal vector of a surface of the oxide semiconductor layer.

18. The semiconductor device according to claim 14, wherein the oxide semiconductor layer comprises at least indium (In) or zinc (Zn).

19. The semiconductor device according to claim 14, wherein the oxide semiconductor layer includes low-resistance regions between which the channel region is sandwiched.

* * * * *